United States Patent
Chun et al.

(10) Patent No.: US 11,990,381 B2
(45) Date of Patent: *May 21, 2024

(54) INTEGRATED CIRCUIT PACKAGES HAVING SUPPORT RINGS

(71) Applicant: Taiwan Semiconductor Manufacturing Company, Ltd., Hsinchu (TW)

(72) Inventors: Shu-Rong Chun, Zhubei (TW); Kuo Lung Pan, Hsinchu (TW); Tin-Hao Kuo, Hsinchu (TW); Hao-Yi Tsai, Hsinchu (TW); Pei-Hsuan Lee, Tainan (TW); Chien Ling Hwang, Hsinchu (TW); Yu-Chia Lai, Zhunan Township (TW); Po-Yuan Teng, Hsinchu (TW); Chen-Hua Yu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/986,498

(22) Filed: Nov. 14, 2022

(65) Prior Publication Data
US 2023/0103560 A1    Apr. 6, 2023

Related U.S. Application Data

(60) Continuation of application No. 17/315,735, filed on May 10, 2021, now Pat. No. 11,502,013, which is a
(Continued)

(51) Int. Cl.
*H01L 23/32* (2006.01)
*H01L 21/56* (2006.01)
(Continued)

(52) U.S. Cl.
CPC .............. *H01L 23/31* (2013.01); *H01L 21/56* (2013.01); *H01L 23/32* (2013.01);
(Continued)

(58) Field of Classification Search
CPC ......... H01L 23/31; H01L 21/56; H01L 23/32; H01L 23/5386; H01L 23/562; H01L 25/0655; H01L 2023/4075
(Continued)

(56) References Cited

U.S. PATENT DOCUMENTS 7,518,235 B2    4/2009   Coico et al.
7,796,395 B2    9/2010   Kim
(Continued)

FOREIGN PATENT DOCUMENTS

CN    106158819 A    11/2016
CN    106816421 A    6/2017
(Continued)

OTHER PUBLICATIONS

Fang et al., "Emerging Fine Line Panel Level Fan Out Technology," 2018 China Semiconductor Technology International Conference (CSTIC), 2018, doi:10.1109/cstic.2018.8369302, 4 pages.
(Continued)

*Primary Examiner* — Didarul A Mazumder
(74) *Attorney, Agent, or Firm* — Slater Matsil, LLP

(57) ABSTRACT

In an embodiment, a device includes: a package component including: integrated circuit dies; an encapsulant around the integrated circuit dies; a redistribution structure over the encapsulant and the integrated circuit dies, the redistribution structure being electrically coupled to the integrated circuit dies; sockets over the redistribution structure, the sockets being electrically coupled to the redistribution structure; and a support ring over the redistribution structure and surrounding the sockets, the support ring being disposed along
(Continued)

outermost edges of the redistribution structure, the support ring at least partially laterally overlapping the redistribution structure.

20 Claims, 20 Drawing Sheets

Related U.S. Application Data division of application No. 16/442,907, filed on Jun. 17, 2019, now Pat. No. 11,004,758.

(51) Int. Cl.
*H01L 23/00* (2006.01)
*H01L 23/31* (2006.01)
*H01L 23/538* (2006.01)
*H01L 25/065* (2023.01)

(52) U.S. Cl.
CPC ........ *H01L 23/5386* (2013.01); *H01L 23/562* (2013.01); *H01L 25/0655* (2013.01)

(58) Field of Classification Search
USPC .......................................................... 257/692
See application file for complete search history.

(56) References Cited

U.S. PATENT DOCUMENTS

| | | | |
|---|---|---|---|
| 8,361,842 B2 | 1/2013 | Yu et al. | |
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 9,543,249 B1 | 1/2017 | Hu | |
| 10,157,899 B2 | 12/2018 | Yu et al. | |
| 10,566,288 B2 | 2/2020 | Kao et al. | |
| 11,315,805 B2 | 4/2022 | Yu et al. | |
| 11,502,013 B2* | 11/2022 | Chun .................... H01L 23/562 |
| 2009/0140442 A1 | 6/2009 | Lin | |
| 2011/0291288 A1 | 12/2011 | Wu et al. | |
| 2013/0001776 A1 | 1/2013 | Yu et al. | |
| 2013/0016477 A1 | 1/2013 | Yokoya et al. | |
| 2013/0026468 A1 | 1/2013 | Yoshimuta et al. | |
| 2013/0062760 A1 | 3/2013 | Hung et al. | |
| 2013/0062761 A1 | 3/2013 | Lin et al. | |
| 2013/0168848 A1 | 7/2013 | Lin et al. | |
| 2013/0307140 A1 | 11/2013 | Huang et al. | |
| 2014/0203429 A1 | 7/2014 | Yu et al. | |
| 2014/0225222 A1 | 8/2014 | Yu et al. | |
| 2014/0239488 A1 | 8/2014 | Kobayashi et al. | |
| 2014/0252646 A1 | 9/2014 | Hung et al. | |
| 2014/0264930 A1 | 9/2014 | Yu et al. | |
| 2015/0084206 A1 | 3/2015 | Lin | |
| 2015/0166329 A1 | 6/2015 | Cheng et al. | |
| 2015/0364386 A1 | 12/2015 | Yu et al. | |
| 2016/0155723 A1 | 6/2016 | Lou | |
| 2016/0197067 A1 | 7/2016 | Wu | |
| 2017/0033080 A1 | 2/2017 | Chen et al. | |
| 2017/0084590 A1 | 3/2017 | Yu et al. | |
| 2017/0084596 A1 | 3/2017 | Scanlan | |
| 2017/0196075 A1 | 7/2017 | Barron et al. | |
| 2017/0372935 A1 | 12/2017 | Val | |
| 2018/0261554 A1* | 9/2018 | Huang .................. H01L 23/562 |
| 2019/0333851 A1 | 10/2019 | Agarwal et al. | |

FOREIGN PATENT DOCUMENTS

| | | |
|---|---|---|
| KR | 100955936 B1 | 5/2010 |
| KR | 20160029648 A | 3/2016 |
| KR | 20170063345 A | 6/2017 |

OTHER PUBLICATIONS

Hacker News, May 10, 2017, 1 page.
Kripesh, et al., "Design and Development of a Multi-Die Embedded Micro Wafer Level Package," 2008 58th Electronic Components and Technology Conference, 2008, doi:10.1109/ect.2008.4550181, 7 pages.
Lau, J., "Fan-Out Wafer-Level Packaging for 3DIC Heterogeneous Integration," IEEE/EPS Chapter Lecture in the Silicon Valley Area, Jan. 25, 2018, 79 pages.
Rao et al., "Development of High Density Fan Out Wafer Level Package (HD FOWLP) With Multi-layer Fine Pitch RDL for Mobile Applications," 2016 IEEE 66th Electronic Components and Technology Conference (ECTC), 2016, doi:10.1190/ectc.2016.203, 8 pages.
Strothmann, "Optimizing Equipment Selection for Diverse Fan-Out Process Flows," Semicon Taiwan, 2016, 22 pages.
Zoberbier et al., "SUSS Microtec's Unique DSC300 GEN2 Platform—Combined Projection Lithography Performance With Advantages of Full-Field Exposure," SUSS Report, 2015, 10 pages.
Zoschke, et al., "Full Wafer Redistribution and Wafer Embedding as Key Technologies for a Multi-Scale Neuromorphic Hardware Cluster," 2017 IEEE 19th Electronics Packaging Technology Conference (EPTC), 2017, doi:10.1109/eptc.2017.8277579, 8 pages.

* cited by examiner

INTEGRATED CIRCUIT PACKAGES HAVING SUPPORT RINGS

PRIORITY CLAIM AND CROSS-REFERENCE

This application is a continuation of U.S. patent application Ser. No. 17/315,735, entitled "Integrated Circuit Package and Method," filed May 10, 2021, which is a divisional of U.S. patent application Ser. No. 16/442,907, entitled "Integrated Circuit Package and Method," filed Jun. 17, 2019, now U.S. Pat. No. 11,004,758, issued on May 11, 2021, which applications are hereby incorporated herein by reference.

BACKGROUND

As semiconductor technologies continue to evolve, integrated circuit dies are becoming increasingly smaller. Further, more functions are being integrated into the dies. Accordingly, the numbers of input/output (I/O) pads needed by dies has increased while the area available for the I/O pads has decreased. The density of the I/O pads has risen quickly over time, increasing the difficulty of die packaging.

In some packaging technologies, integrated circuit dies are singulated from wafers before they are packaged. An advantageous feature of this packaging technology is the possibility of forming fan-out packages, which allow the I/O pads on a die to be redistributed to a greater area. The number of I/O pads on the surfaces of the dies may thus be increased.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
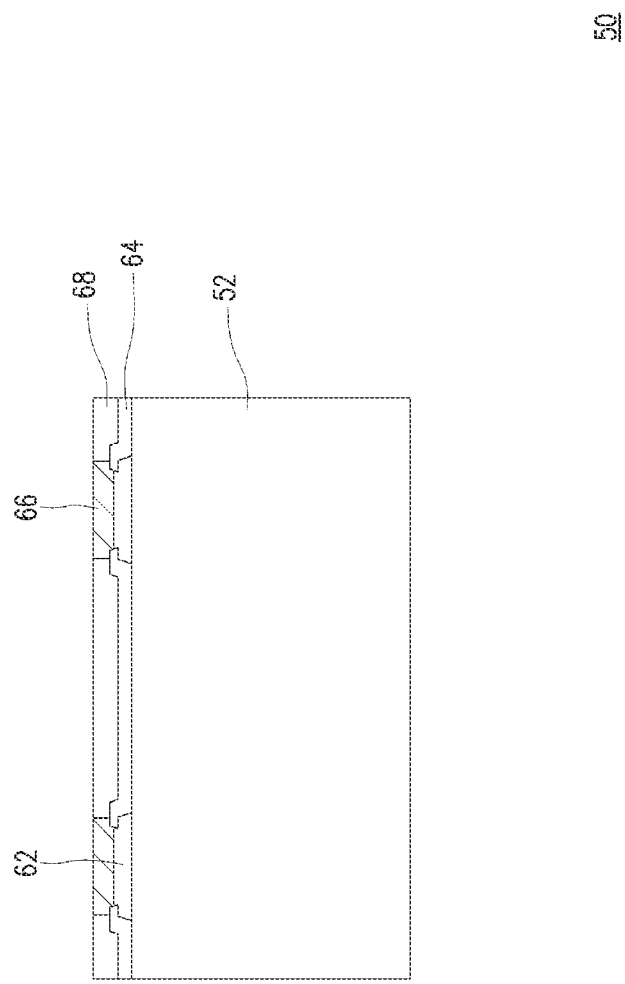
FIG. 1 illustrates a cross-sectional view of an integrated circuit die, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a system-on-wafer assembly is formed by clamping a package structure between a thermal module and a mechanical brace. A support ring is attached around the periphery of the package structure before the package structure is removed from a carrier substrate. The support ring provides mechanical support to the package structure, thereby reducing warpage of the system-on-wafer assembly after carrier substrate removal. Reducing warpage of the system-on-wafer assembly helps increase the uniformity of pressure exerted on the thermal module. Thermal dissipation from the assembly may thus be improved.

FIG. 1 illustrates a cross-sectional view of an integrated circuit die 50, in accordance with some embodiments. The integrated circuit die 50 will be packaged in subsequent processing to form an integrated circuit package. The integrated circuit die 50 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), an application-specific die (e.g., an application-specific integrated circuit (ASIC), a field-programmable gate array (FPGA), etc.), the like, or combinations thereof.

The integrated circuit die 50 may be formed in a wafer, which may include different device regions that are singulated in subsequent steps to form a plurality of integrated circuit dies. The integrated circuit die 50 may be processed according to applicable manufacturing processes to form integrated circuits. For example, the integrated circuit die 50 includes a semiconductor substrate 52, such as silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 1), sometimes called a front side, and an inactive surface (e.g., the surface facing downwards in FIG. 1), sometimes called a back side. Devices may be formed at the front surface of the semiconductor substrate 52. The devices may be active devices (e.g., transistors, diodes, etc.), capacitors, resistors, etc. An interconnect structure is over the semiconductor substrate 52, and interconnects the devices to form an integrated circuit. The interconnect structure may be formed by, for example, metallization patterns in dielectric layers on the semiconductor substrate 52. The metallization patterns include metal lines and vias formed in one or more low-k dielectric layers. The metallization patterns of the interconnect structure are electrically coupled to the devices of the semiconductor substrate 52.

The integrated circuit die 50 further includes pads 62, such as aluminum pads, to which external connections are made. The pads 62 are on the active side of the integrated circuit die 50, such as in and/or on the interconnect structure. One or more passivation films 64 are on the integrated circuit die 50, such as on portions of the interconnect structure and pads 62. Openings extend through the passivation films 64 to the pads 62. Die connectors 66, such as conductive pillars (for example, formed of a metal such as copper), extend through the openings in the passivation films 64 and are physically and electrically coupled to respective ones of the pads 62. The die connectors 66 may be formed by, for example, plating, or the like. The die connectors 66 electrically couple the respective integrated circuits of the integrated circuit die 50.

Optionally, solder regions (e.g., solder balls or solder bumps) may be disposed on the pads 62. The solder balls may be used to perform chip probe (CP) testing on the integrated circuit die 50. CP testing may be performed on the integrated circuit die 50 to ascertain whether the integrated circuit die 50 is a known good die (KGD). Thus, only integrated circuit dies 50, which are KGDs, undergo subsequent processing are packaged, and dies, which fail the CP testing, are not packaged. After testing, the solder regions may be removed in subsequent processing steps.

A dielectric layer 68 may (or may not) be on the active side of the integrated circuit die 50, such as on the passivation films 64 and the die connectors 66. The dielectric layer 68 laterally encapsulates the die connectors 66, and the dielectric layer 68 is laterally coterminous with the integrated circuit die 50. Initially, the dielectric layer 68 may bury the die connectors 66, such that the topmost surface of the dielectric layer 68 is above the topmost surfaces of the die connectors 66. In some embodiments where solder regions are disposed on the die connectors 66, the dielectric layer 68 may also bury the solder regions. Alternatively, the solder regions may be removed prior to forming the dielectric layer 68.

The dielectric layer 68 may be a polymer such as polybenzoxazole (PBO), polyimide, benzocyclobutene (BCB), or the like; a nitride such as silicon nitride or the like; an oxide such as silicon oxide, phosphosilicate glass (PSG), borosilicate glass (BSG), boron-doped phosphosilicate glass (BPSG), or the like; the like, or a combination thereof. The dielectric layer 68 may be formed, for example, by spin coating, lamination, chemical vapor deposition (CVD), or the like. In some embodiments, the die connectors 66 are exposed through the dielectric layer 68 during formation of the integrated circuit die 50. In some embodiments, the die connectors 66 remain buried and are exposed during a subsequent process for packaging the integrated circuit die 50. Exposing the die connectors 66 may remove any solder regions that may be present on the die connectors 66.

In some embodiments, the integrated circuit die 50 is a stacked device that includes multiple semiconductor substrates 52. For example, the integrated circuit die 50 may be a memory device such as a hybrid memory cube (HMC) device, a high bandwidth memory (HBM) device, or the like that includes multiple memory dies. In such embodiments, the integrated circuit die 50 includes multiple semiconductor substrates 52 interconnected by through-substrate vias (TSVs). Each of the semiconductor substrates 52 may (or may not) have an interconnect structure.

Figure 6:
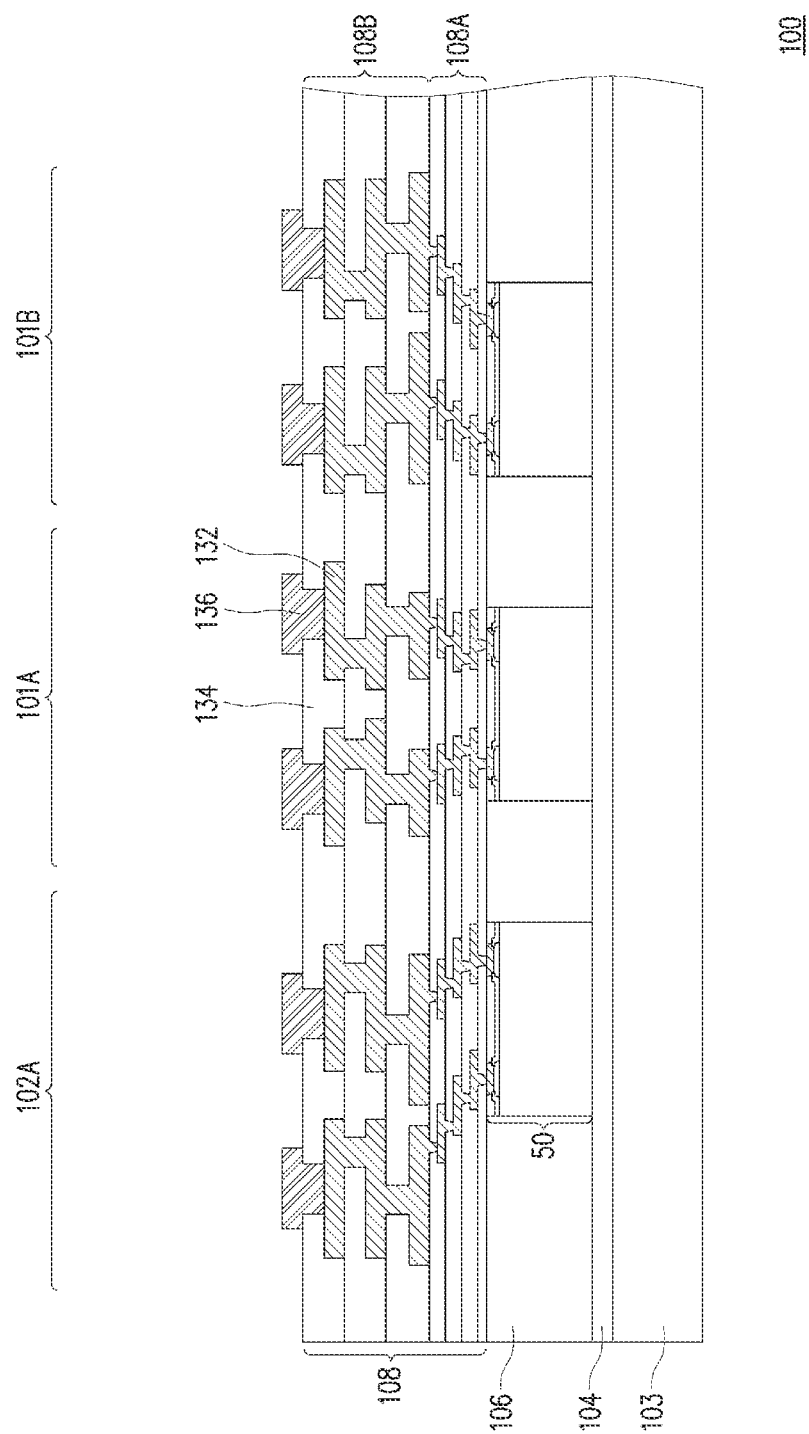
Figure 7:
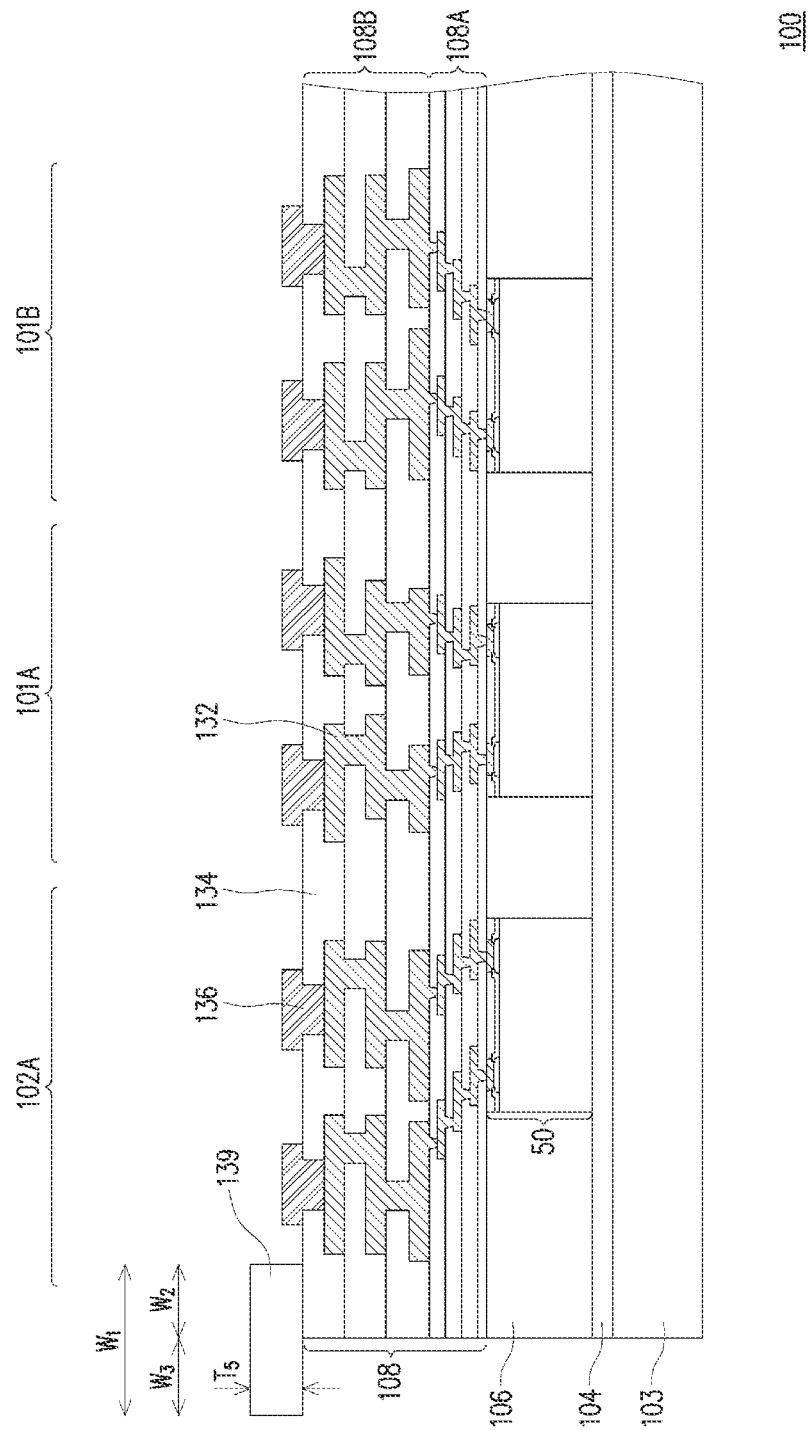
Figure 8:
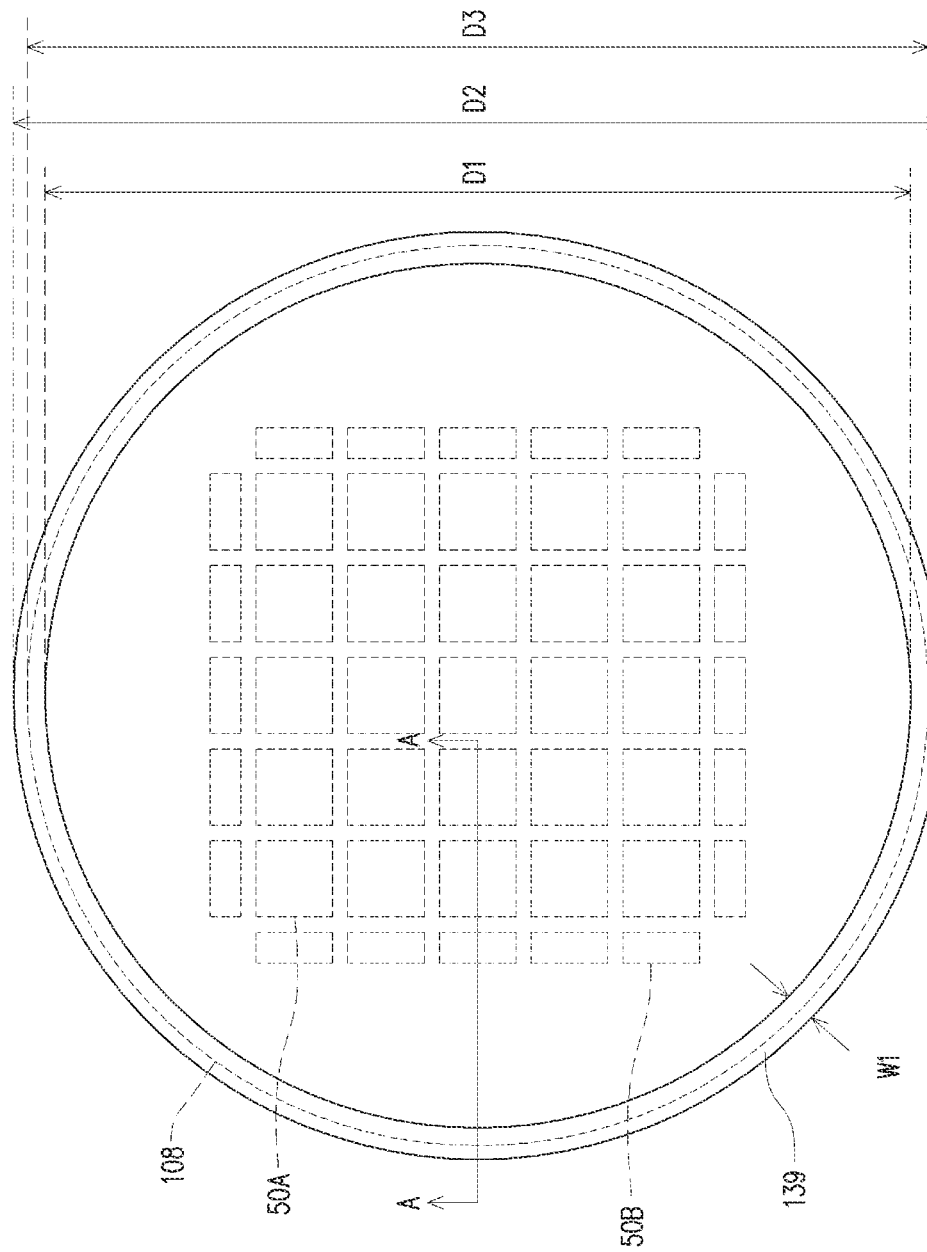
Figure 10:
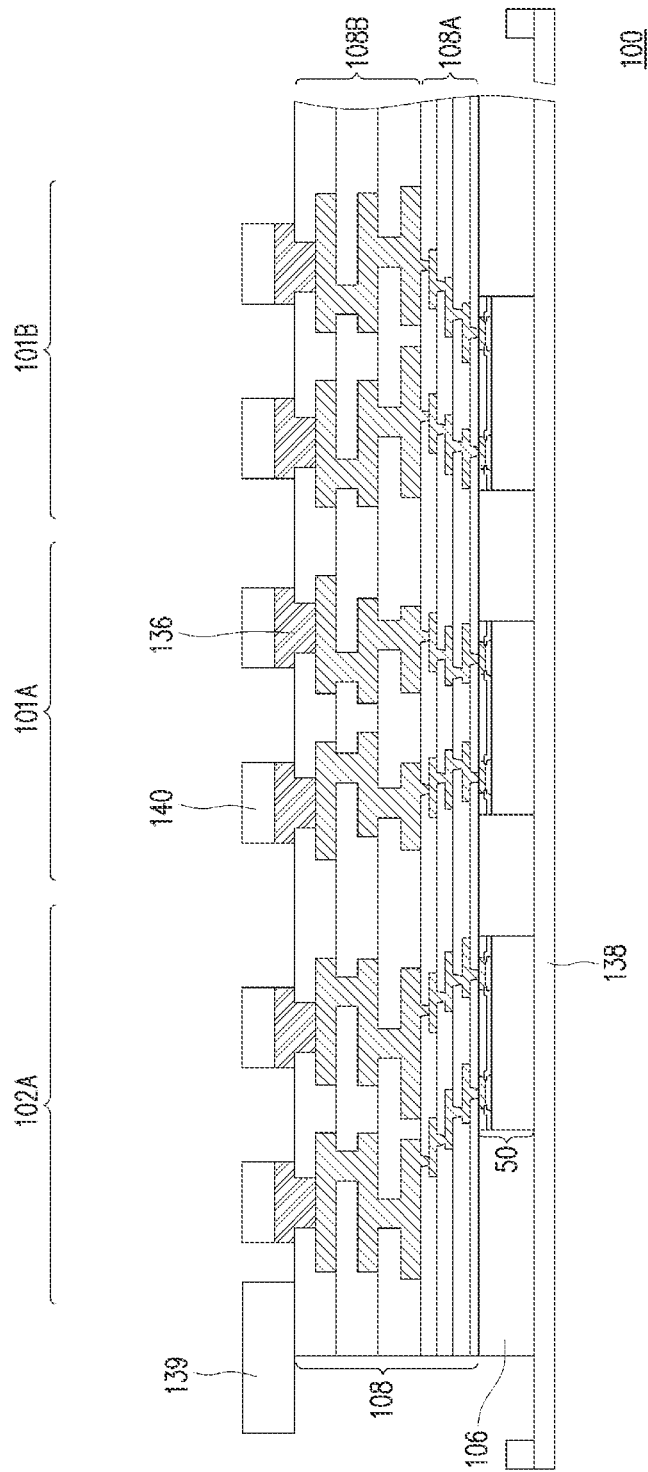
Figure 11:
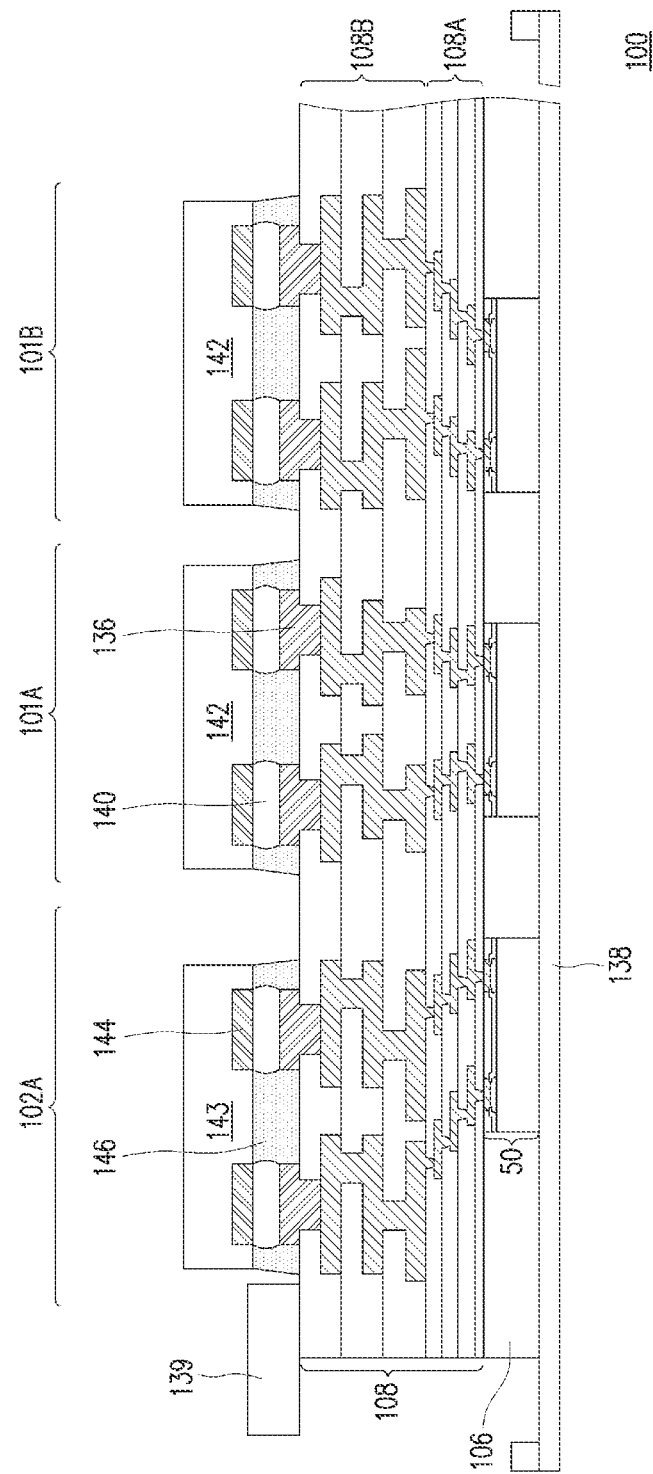
Figure 12:
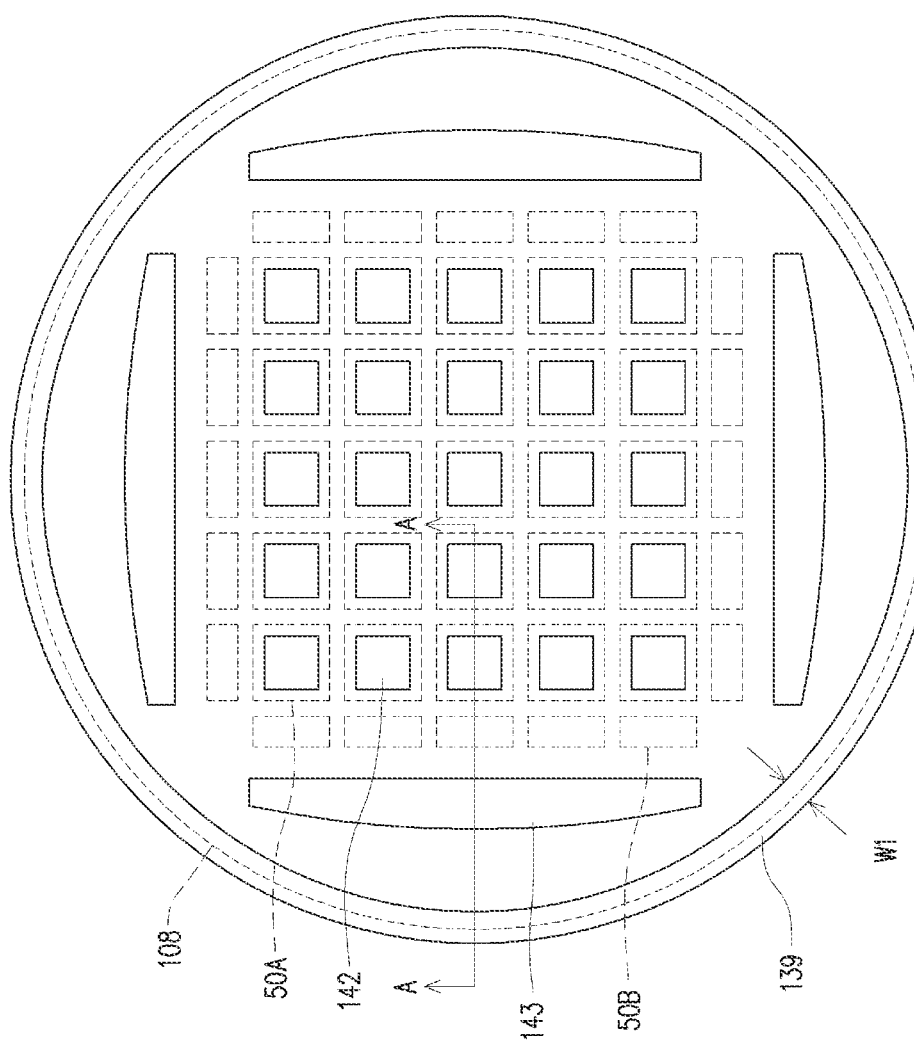

FIGS. 2 through 13 illustrate various views of intermediate steps during a process for forming a package component 100, in accordance with some embodiments. FIGS. 2, 3, 4, 5, 6, 7, 9, 10, 11, and 13 are cross-sectional views, and FIGS. 8 and 12 are top-down views. The package component 100 is a reconstructed wafer having multiple package regions, with one or more of the integrated circuit dies 50 being packaged in each of the package regions. The package regions include computing sites 101 and connecting sites 102. Each of the computing sites 101 may have e.g., logic functions, memory functions, or the like, and the package component 100 may be a single computing device comprising the computing sites 101 and connecting sites 102, such as a system-on-wafer (SoW) device. For example, the package component 100 may be an artificial intelligence (AI) accelerator, and each computing site 101 may be a neural network node for the AI accelerator. Each of the connecting sites 102 may have, e.g., external connectors, and the computing sites 101 of the package component 100 may connect to external systems through the connecting sites 102. Example systems for the package component 100 include AI servers, high-performance computing (HPC) systems, high power computing devices, cloud computing systems, edge computing systems, and the like. Two computing sites 101, e.g., computing sites 101A and 101B, and one connecting site 102, e.g., connecting site 102A, are illustrated, but it should be appreciated that the package component 100 may include many computing sites 101 and connecting sites 102, and the sites may be laid out in a variety of manner. Example layouts for the package component 100 are illustrated and discussed with respect to FIGS. 8 and 12. FIGS. 2, 3, 4, 5, 6, 7, 9, 10, 11, and 13 only show a portion of the package component 100, such as that indicated by cross-section A-A in FIGS. 8 and 12.

Figure 2:
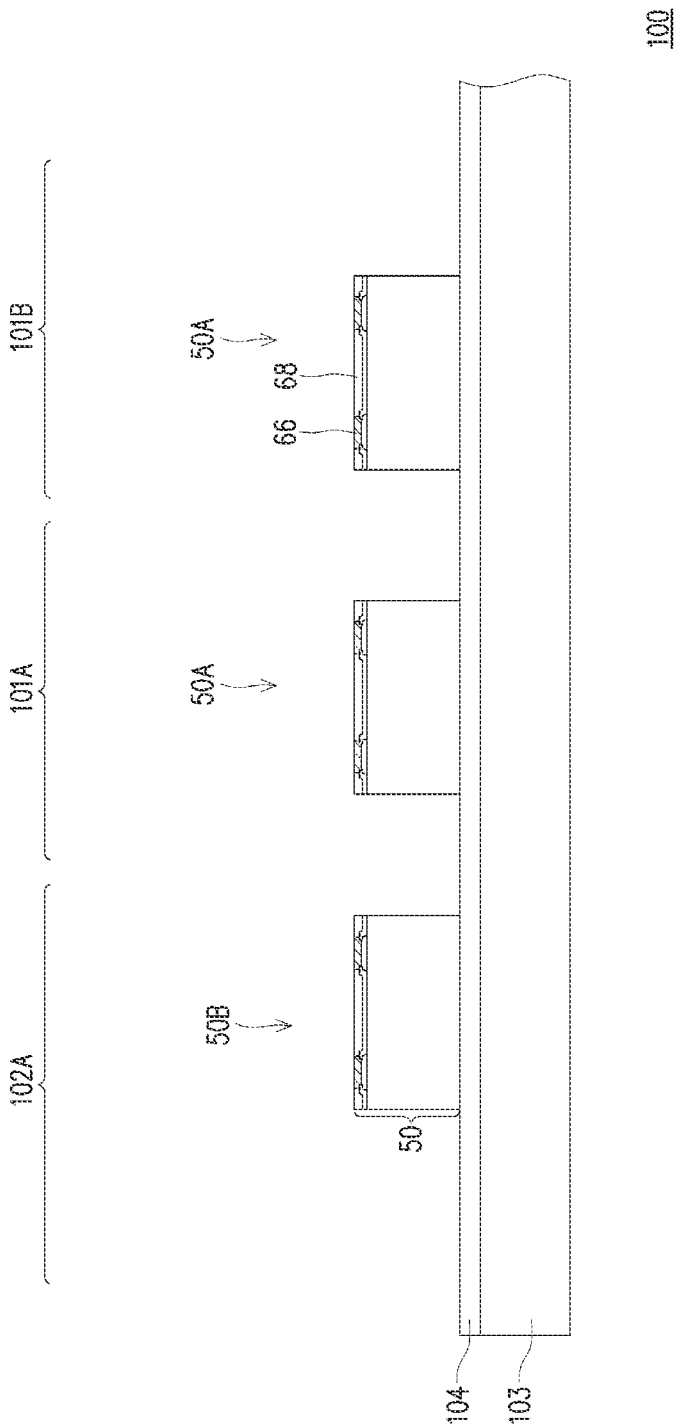
FIGS. 2, 3, 4, 5, 6, 7, 8, 9, 10, 11, 12, and 13 illustrate various views of intermediate steps during a process for forming a package component, in accordance with some embodiments.

In FIG. 2, a carrier substrate 103 is provided, and an adhesive layer 104 is formed on the carrier substrate 103. The carrier substrate 103 may be a glass carrier substrate, a ceramic carrier substrate, or the like. The carrier substrate 103 may be a wafer, such that multiple packages can be formed on the carrier substrate 103 simultaneously. The adhesive layer 104 may be removed along with the carrier substrate 103 from the overlying structures that will be formed in subsequent steps. In some embodiments, the adhesive layer 104 is any suitable adhesive, epoxy, die attach film (DAF), or the like, and is applied over the surface of the carrier substrate 103. In some embodiments, the adhesive layer 104 is an epoxy-based thermal-release material, which loses its adhesive property when heated, such as a light-to-heat-conversion (LTHC) release coating. In other embodiments, the adhesive layer 104 may be an ultra-violet (UV) glue, which loses its adhesive property when exposed to UV lights.

Integrated circuit dies 50 are then attached to the adhesive layer 104. A desired type and quantity of integrated circuit dies 50 are attached in each of the computing sites 101A and 101B and the connecting site 102A. In some embodiments, a first type of integrated circuit die, such as a SoC die 50A, is attached in each computing site 101A and 101B, and a second type of integrated circuit die, such as an I/O interface die 50B, is attached in the connecting site 102A. Although a single integrated circuit die 50 is illustrated in each site, it should be appreciated that multiple integrated circuit dies may be attached adjacent one another some or all of the sites. When multiple integrated circuit dies are attached in each computing site 101A and 101B, they may be of the same technology node, or different technology nodes. For example, the integrated circuit dies 50 may include dies formed at a 10 nm technology node, dies formed at a 7 nm technology node, the like, or combinations thereof.

Figure 3:
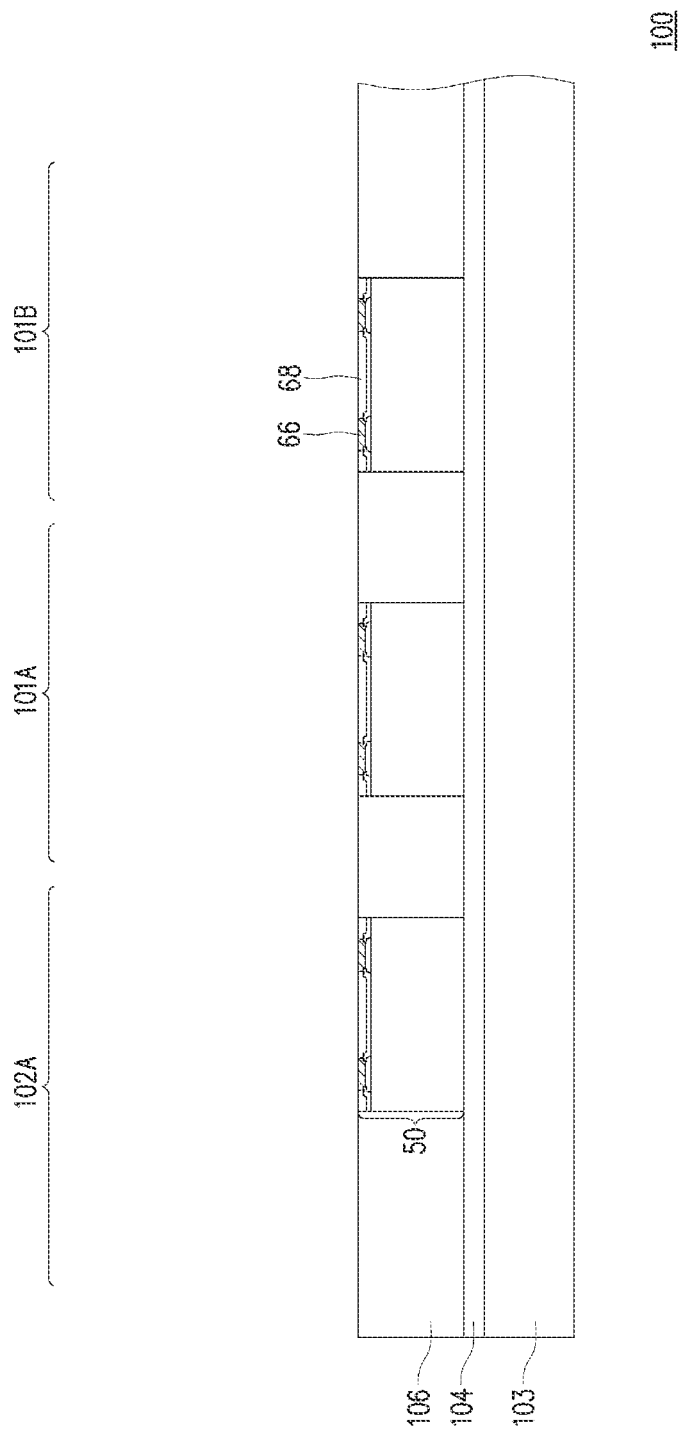

In FIG. 3, an encapsulant 106 is formed on and around the various components. After formation, the encapsulant 106 encapsulates the integrated circuit dies 50. The encapsulant 106 may be a molding compound, epoxy, or the like, and may be applied by compression molding, transfer molding, or the like. The encapsulant 106 may be applied in liquid or semi-liquid form and then subsequently cured. In some embodiments, the encapsulant 106 is formed over the carrier substrate 103 such that the integrated circuit dies 50 are buried or covered, and a planarization process is then performed on the encapsulant 106 to expose the die connectors 66 of the integrated circuit dies 50. Topmost surfaces of the encapsulant 106, die connectors 66, and dielectric layers 68 are coplanar after the planarization process. The planarization process may be, for example, a chemical-mechanical polish (CMP).

Figure 4:
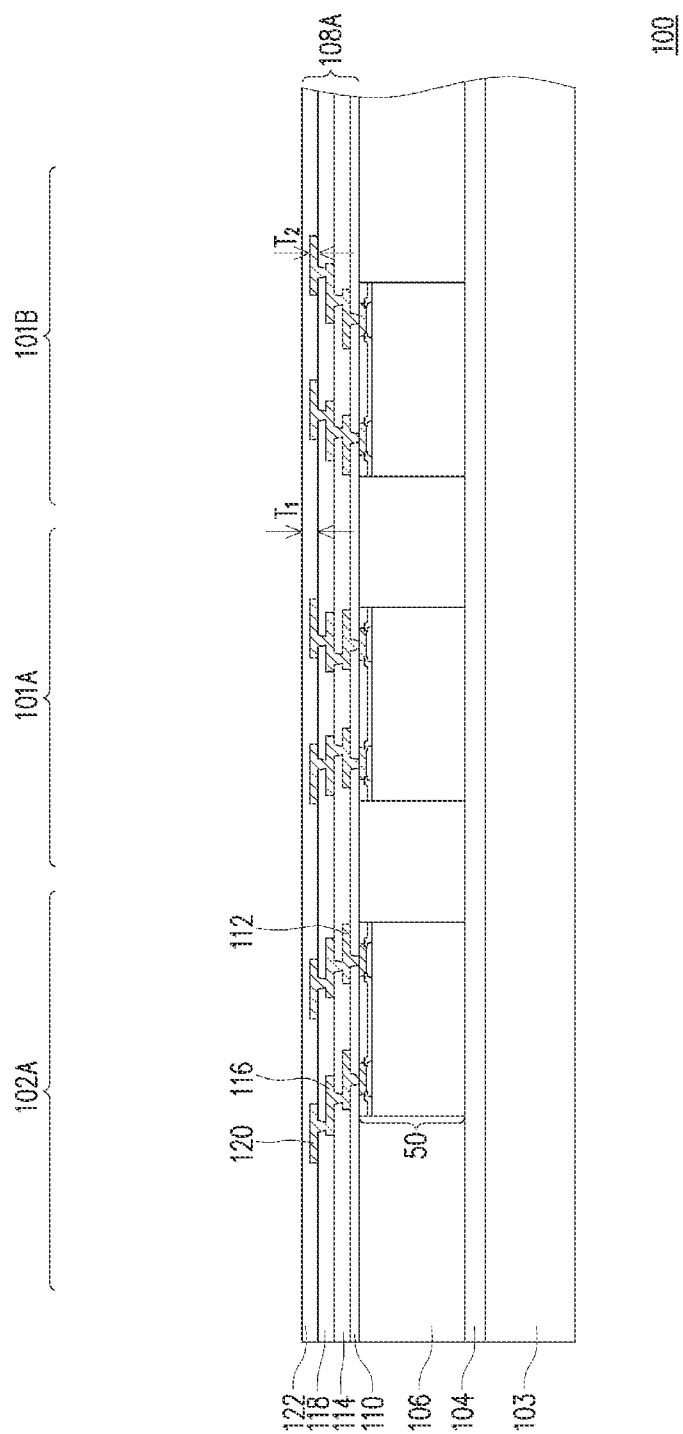
Figure 5:
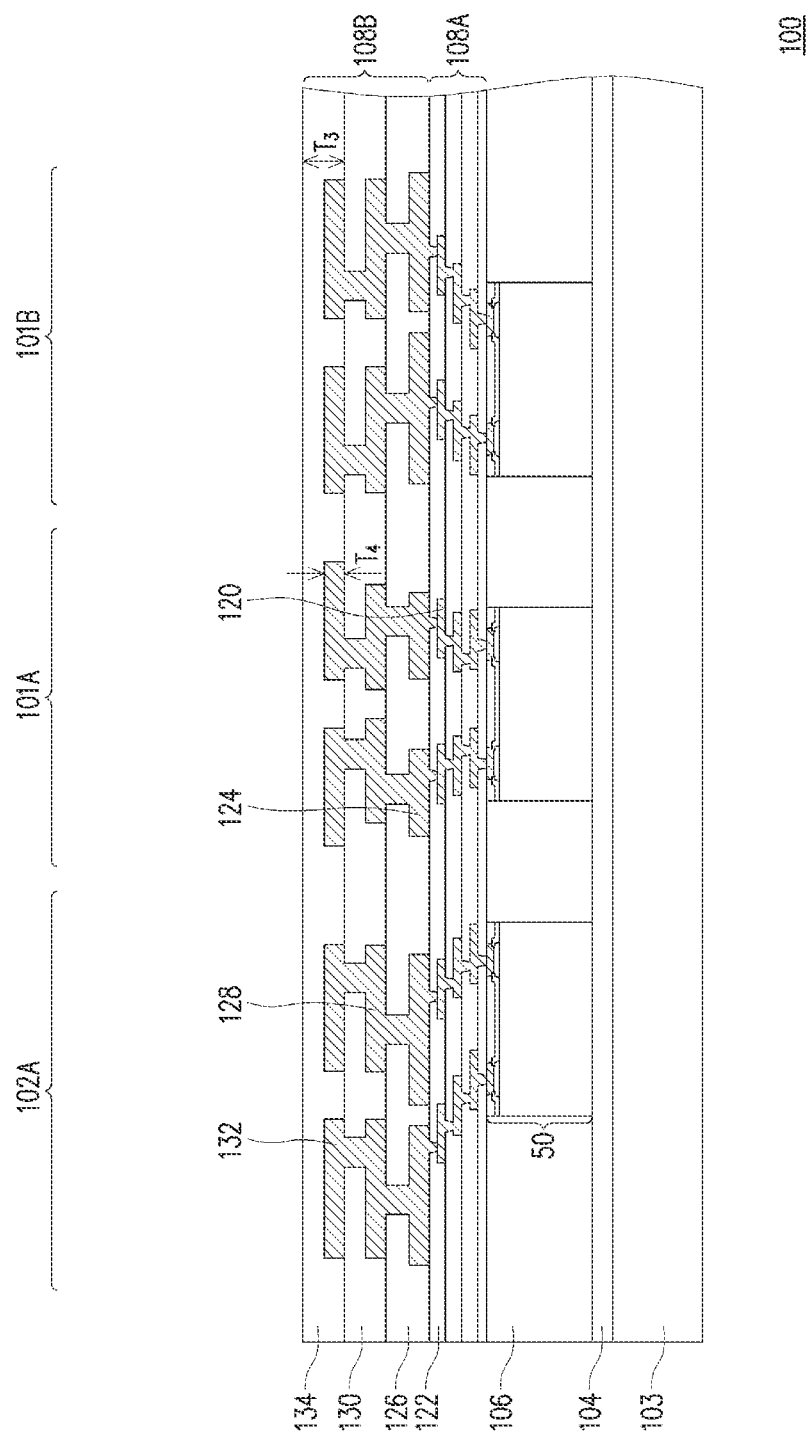

In FIGS. 4 through 6, a redistribution structure 108 having a fine-featured portion 108A and a coarse-featured portion 108B (see FIG. 6) is formed over the encapsulant 106 and integrated circuit dies 50. The redistribution structure 108 includes metallization patterns, dielectric layers, and under-bump metallurgies (UBMs). The metallization patterns may also be referred to as redistribution layers or redistribution lines. The redistribution structure 108 is shown as an example having six layers of metallization patterns. More or fewer dielectric layers and metallization patterns may be formed in the redistribution structure 108. If fewer dielectric layers and metallization patterns are to be formed, steps and process discussed below may be omitted. If more dielectric layers and metallization patterns are to be formed, steps and processes discussed below may be repeated. The fine-featured portion 108A and coarse-featured portion 108B of the redistribution structure 108 include metallization patterns and dielectric layers of differing sizes.

In FIG. 4, the fine-featured portion 108A of the redistribution structure 108 is formed. The fine-featured portion 108A of the redistribution structure 108 includes dielectric layers 110, 114, 118, and 122; and metallization patterns 112, 116, and 120. In some embodiments, the dielectric layers 114, 118 and 122 are formed from a same dielectric material, and are formed to a same thickness. Likewise, in some embodiments, the conductive features of the metallization patterns 112, 116 and 120 are formed from a same conductive material, and are formed to a same thickness. In particular, the dielectric layers 114, 118 and 122 have a first thickness $T_1$ that is small, such as in the range of about 3 μm to about 15 μm, and the conductive features of the metallization patterns 112, 116 and 120 have a second thickness $T_2$ that is small, such as in the range of about 0.5 μm to about 6 μm.

As an example of forming the fine-featured portion 108A of the redistribution structure 108, the dielectric layer 110 is deposited on the encapsulant 106, dielectric layers 68, and die connectors 66. In some embodiments, the dielectric layer 110 is formed of a photo-sensitive material such as PBO, polyimide, BCB, or the like, which may be patterned using a lithography mask. The dielectric layer 110 may be formed by spin coating, lamination, CVD, the like, or a combination thereof. The dielectric layer 110 is then patterned. The patterning forms openings exposing portions of the die connectors 66. The patterning may be by an acceptable process, such as by exposing the dielectric layer 110 to light when the dielectric layer 110 is a photo-sensitive material or by etching using, for example, an anisotropic etch. If the dielectric layer 110 is a photo-sensitive material, the dielectric layer 110 can be developed after the exposure.

The metallization pattern 112 is then formed. The metallization pattern 112 has line portions (also referred to as conductive lines or traces) on and extending along the major surface of the dielectric layer 110, and has via portions (also referred to as conductive vias) extending through the dielectric layer 110 to physically and electrically couple the die connectors 66 of the integrated circuit dies 50. As an example to form the metallization pattern 112, a seed layer is formed over the dielectric layer 110 and in the openings extending through the dielectric layer 110. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning. The pattern of the photoresist corresponds to the metallization pattern 112. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 112. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

The dielectric layer 114 is then deposited on the metallization pattern 112 and dielectric layer 110. The dielectric layer 114 may be formed in a similar manner and of a similar material as the dielectric layer 110. The metallization pattern 116 is then formed. The metallization pattern 116 has line portions on and extending along the major surface of the dielectric layer 114, and has via portions extending through the dielectric layer 114 to physically and electrically couple the metallization pattern 112. The metallization pattern 116 may be formed in a similar manner and of a similar material as the metallization pattern 112.

The dielectric layer 118 is then deposited on the metallization pattern 116 and dielectric layer 114. The dielectric layer 118 may be formed in a similar manner and of a similar material as the dielectric layer 110. The metallization pattern 120 is then formed. The metallization pattern 120 has line portions on and extending along the major surface of the dielectric layer 118, and has via portions extending through the dielectric layer 118 to physically and electrically couple the metallization pattern 116. The metallization pattern 120 may be formed in a similar manner and of a similar material as the metallization pattern 112.

The dielectric layer 122 is deposited on the metallization pattern 120 and dielectric layer 118. The dielectric layer 122 may be formed in a similar manner and of a similar material as the dielectric layer 110.

In FIG. 5, the coarse-featured portion 108B of the redistribution structure 108 is formed. The coarse-featured portion 108B of the redistribution structure 108 includes dielectric layers 126, 130, and 134; and metallization patterns 124, 128, and 132. In some embodiments, the dielectric layers 126, 130, and 134 are formed from a same dielectric material, and are formed to a same thickness. Likewise, in some embodiments, the conductive features of the metallization patterns 124, 128, and 132 are formed from a same conductive material, and are formed to a same thickness. In particular, the dielectric layers 126, 130, and 134 have a third thickness $T_3$ that is large, such as in the range of about 10 μm to about 80 μm, and the conductive features of the metallization patterns 124, 128, and 132 have a fourth thickness $T_4$ that is large, such as in the range of about 3 μm to about 50 μm. The third thickness $T_3$ is greater than the first thickness $T_1$ (see FIG. 4), and the fourth thickness $T_4$ is greater than the second thickness $T_2$ (see FIG. 4).

As an example of forming the coarse-featured portion 108B of the redistribution structure 108, the metallization pattern 124 is formed. The metallization pattern 124 is then formed. The metallization pattern 124 has line portions on and extending along the major surface of the dielectric layer 122, and has via portions extending through the dielectric layer 122 to physically and electrically couple the metallization pattern 120. As an example to form the metallization pattern 124, a seed layer is formed over the dielectric layer 122 and in the openings extending through the dielectric layer 122. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 124. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 124. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

The dielectric layer 126 is then deposited on the metallization pattern 124 and dielectric layer 122. In some embodiments, the dielectric layer 126 is formed of a photo-sensitive material such as PBO, polyimide, BCB, or the like, which may be patterned using a lithography mask. The dielectric layer 126 may be formed by spin coating, lamination, CVD, the like, or a combination thereof. The metallization pattern 128 is then formed. The metallization pattern 128 has line portions on and extending along the major surface of the dielectric layer 126, and has via portions extending through the dielectric layer 126 to physically and electrically couple the metallization pattern 124. The metallization pattern 128 may be formed in a similar manner and of a similar material as the metallization pattern 124.

The dielectric layer 130 is then deposited on the metallization pattern 128 and dielectric layer 126. The dielectric layer 130 may be formed in a similar manner and of a similar material as the dielectric layer 126. The metallization pattern 132 is then formed. The metallization pattern 132 has line portions on and extending along the major surface of the dielectric layer 130, and has via portions extending through the dielectric layer 130 to physically and electrically couple the metallization pattern 128. The metallization pattern 132 may be formed in a similar manner and of a similar material as the metallization pattern 124.

The dielectric layer 134 is deposited on the metallization pattern 132 and dielectric layer 130. The dielectric layer 134 may be formed in a similar manner and of a similar material as the dielectric layer 126.

In FIG. 6, UBMs 136 are formed for external connection to the redistribution structure 108. The UBMs 136 have bump portions on and extending along the major surface of the dielectric layer 134, and have via portions extending through the dielectric layer 134 to physically and electrically couple the metallization pattern 132. As a result, the UBMs 136 are electrically coupled to the integrated circuit dies 50. The UBMs 136 may be formed in a similar manner and of a similar material as the metallization pattern 132. In some embodiments, the UBMs 136 have a different size than the metallization patterns 112, 116, 120, 124, 128, and 132.

In FIG. 7, a support ring 139 is attached to the redistribution structure 108. FIG. 8 is a top-down view of the package component 100 after attaching the support ring 139, and is described in conjunction with FIG. 7. The support ring 139 extends around the periphery of the package component 100, e.g., along the outermost edges of the redistribution structure 108. As discussed further below, the package component 100 may have several possible shapes in the top-down view. The support ring 139 has the same top-down shape as the package component 100. In this embodiment, the package component 100 and support ring 139 have non-truncated circular shapes. It should be appreciated that the package component 100 and support ring 139 may have other shapes, such as regular or irregular polygonal shapes.

The support ring 139 is secured to the redistribution structure 108 by an adhesive, and optionally by mechanically fasteners. An adhesive, such as any suitable glue, epoxy, or the like, is used to adhere the support ring 139 to the redistribution structure 108. The adhesive may be dispensed on the support ring 139 or the redistribution structure 108 before the support ring 139 is placed on the periphery of the redistribution structure 108, and may be cured before further processing. In some embodiments, the support ring 139 is also mechanically fastened to the redistribution structure 108 with, e.g., bolts and fasteners (discussed further below).

The support ring 139 is formed from a material with a high stiffness, such as a metal, e.g., steel, titanium, cobalt, or the like. The support ring 139 has a greater stiffness than other components of the package component 100. In other words, the Young's modulus of the support ring 139 may be greater than the Young's modulus of the redistribution structure 108, encapsulant 106, and integrated circuit dies 50. For example, the Young's modulus of the support ring 139 can be in the range of about 10 GPa to about 1000 GPa. Conversely the Young's modulus of the redistribution structure 108 can be in the range of about 1 GPa to about 12 GPa, the Young's modulus of the encapsulant 106 can be in the range of about 10 GPa to about 30 GPa, and the Young's modulus of the integrated circuit dies 50 can be in the range of about 100 GPa to about 200 GPa. Because the support ring 139 has a high stiffness, it provides mechanical support for the package component 100 during a subsequent carrier substrate debonding process (discussed further below).

The support ring 139 has an inner width and an outer width. In the embodiment illustrated, the support ring 139 is an annulus, having an inner diameter $D_1$ and an outer diameter $D_2$. For example, the inner diameter $D_1$ can be in the range of about 280 mm to about 299.5 mm, and the outer diameter $D_2$ can be in the range of about 300.5 mm to about 320.5 mm. The support ring 139 has a thickness $T_5$, which can be in the range of about 0.5 mm to about 20 mm, and has a width $W_1$, which can be in the range of about 0.5 mm to about 20 mm. The thickness $T_5$ and the width $W_1$ of the support ring 139 collectively determine the amount of mechanical support the support ring 139 provides for the package component 100, where a larger width $W_1$ and/or thickness $T_5$ provides greater mechanical support. However, a large width $W_1$ also causes the support ring 139 to occupy more lateral area, reducing the amount of space available for the UBMs 136. A moderately sized width $W_1$, such as a width $W_1$ in the range of about 5 mm to about 7 mm, may provide sufficient mechanical support for the package component 100 without excessively reducing the amount of space available for UBMs 136. Likewise, a large thickness $T_5$ causes the support ring 139 to occupy more vertical area, increasing the height of the package component 100. A moderately sized thickness $T_5$, such as a thickness $T_5$ of about 2 mm, may provide sufficient mechanical support for the package component 100 without excessively increasing bulk of the package component 100.

In the embodiment illustrated, the support ring 139 at least partially laterally overlaps the redistribution structure 108, and extends beyond edges of the redistribution structure 108. In other words, the outermost edges of the support ring 139 may extend beyond the outermost edges of the redistribution structure 108. For example, the redistribution structure 108 has an overall diameter $D_3$ (or more generally, an overall width), which can be in the range of about 250 mm to about 300 mm. The diameter $D_3$ can be less than the outer diameter $D_2$ but greater than the inner diameter $D_1$. The portion of the support ring 139 that overlaps the redistribution structure 108 has a width $W_2$, and the portion of the support ring 139 that extends beyond the edges of the redistribution structure 108 has a width $W_3$. For example, the width $W_2$ can be in the range of about 0.5 mm to about 10 mm, and the width $W_3$ can be in the range of about 0.5 mm to about 10 mm. The width $W_3$ is less than the width $W_2$. In some embodiments, the width $W_3$ is less than about half the width $W_2$. For example, the ratio of the width $W_3$ to the width $W_2$ can be in the range of about 1:10 to about 9:10, such as less than about 1:2. In another embodiment (illustrated below), the support ring 139 is laterally confined within edges of the redistribution structure 108.

Figure 9:
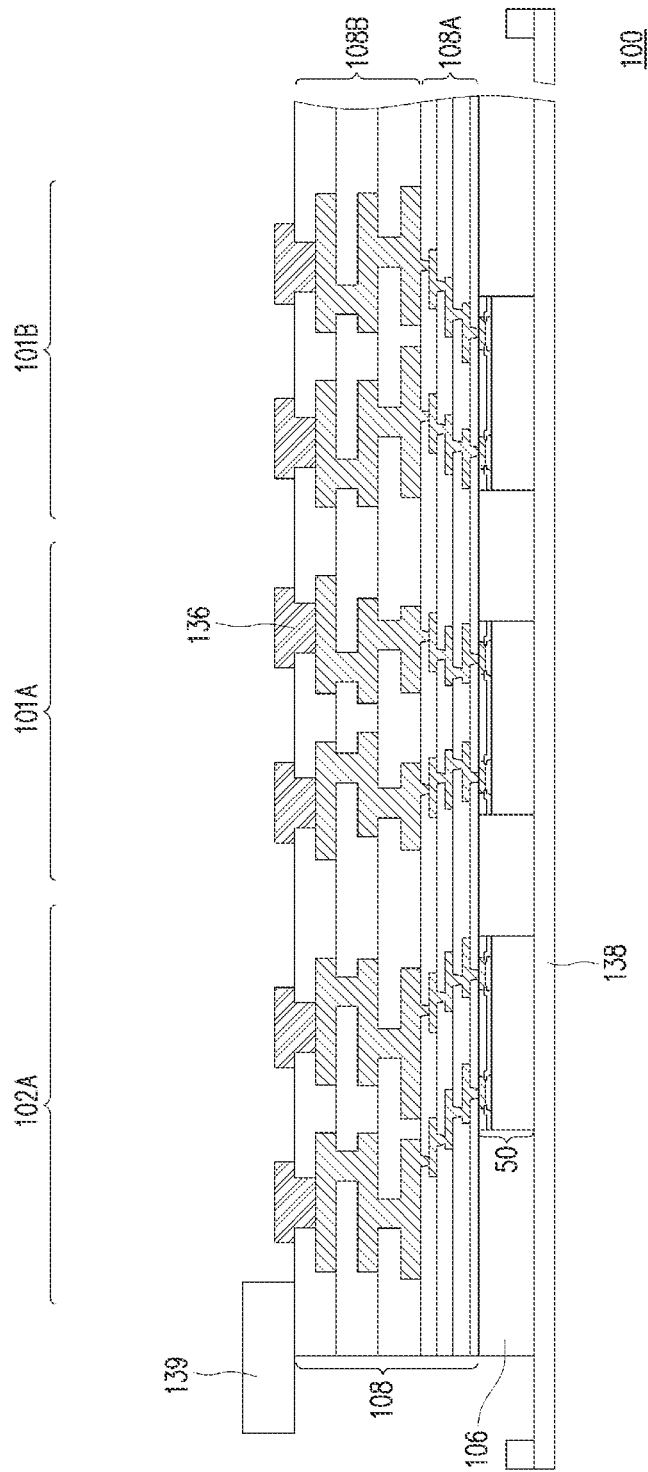

In FIG. 9, a carrier substrate debonding is performed to detach (or "debond") the carrier substrate 103 from the encapsulant 106 and integrated circuit dies 50. In some embodiments, the debonding includes removing the carrier substrate 103 and adhesive layer 104 by, e.g., a grinding or planarization process, such as a CMP. In some embodiments, the debonding includes projecting a light such as a laser light or an UV light on the adhesive layer 104 so that the adhesive layer 104 decomposes under the heat of the light and the carrier substrate 103 can be removed. After removal, back side surfaces of the integrated circuit dies 50 are exposed, and the back side surfaces of the encapsulant 106 and integrated circuit dies 50 are level. The structure is then placed on a tape 138. Debonding the carrier substrate 103 from the package component 100 can result in wafer warpage. The mechanical support provided by the support ring 139 allows it to exert forces on the package component 100 in a direction opposite the direction of wafer warpage. As such, the support ring 139 helps reduce the amount of wafer warpage induced by carrier substrate debonding. In an experiment, the support ring 139 helped reduce wafer warpage by up to 30%.

In FIG. 10, conductive connectors 140 are formed on the UBMs 136. The conductive connectors 140 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 140 may include a conductive material such as solder, copper, aluminum, gold, nickel, silver, palladium, tin, the like, or a combination thereof. In some embodiments, the conductive connectors 140 are formed by initially forming a layer of solder or solder paste through evaporation, electroplating, printing, solder transfer, ball placement, or the like. Once a layer of solder has been formed on the structure, a reflow may be performed in order to shape the material into the desired bump shapes.

In FIG. 11, sockets 142 and connectors 143 are attached to the redistribution structure 108. The sockets 142 and connectors 143 are interfaces for external connection to the package component 100. The sockets 142 and connectors 143 include pads 144, such as aluminum pads, to which external connections are made. The sockets 142 and connectors 143 are mounted to the UBMs 136 using the conductive connectors 140. The sockets 142 and connectors 143 are attached to the redistribution structure 108 after forming the support ring 139, and are disposed inside of the support ring 139 such that the support ring 139 surrounds the sockets 142 and connectors 143. Because the support ring 139 helps reduce warpage of the redistribution structure 108, the heights of the sockets 142 and connectors 143 may be more uniform. The quality of joints formed between the UBMs 136 and the sockets 142 and connectors 143 may thus be improved. In the embodiment shown, the sockets 142 are attached at the computing sites 101A and 101B, and the connectors 143 are attached at the connecting site 102A. An underfill 146 is formed to fill the gaps between the sockets 142 and connectors 143 and the redistribution structure 108. The underfill 146 may be formed by a capillary flow process after the sockets 142 and connectors 143 are attached, or may be formed by a suitable deposition method before the sockets 142 and connectors 143 are attached.

The sockets 142 are electrical and physical interfaces for modules (discussed further below) that may be installed at the computing sites 101A and 101B subsequent to manufacture of the package component 100. For example, a user of the package component 100 may install modules in the sockets 142 to form completed functional systems at the computing sites 101A and 101B. The type of modules selected for installation depends on the type of functional systems desired at the computing sites 101A and 101B. Examples of modules that may be installed in the sockets 142 include memory modules, voltage regulator modules, power supply modules, integrated passive device (IPD) modules, and the like. The sockets 142 may include different components, such as a chassis and contact pins, which may comprise different materials. Although the sockets 142 are formed from multiple, differing materials, the sockets 142 collectively have an average stiffness, which can be quantified by their Yong's modulus. The sockets 142 have a high average stiffness, such as a Young's modulus that can be in the range of about 10 GPa to about 30 GPa. As discussed further below, subsequently formed overlying features have a lower average stiffness than the sockets 142.

The connectors 143 are electrical and physical interfaces for the package component 100 to external systems. For example, when the package component 100 is installed as part of a larger external system, such as a data center, the connectors 143 may be used to couple the package component 100 to the external system. Examples of connectors 143 include receptors for ribbon cables, flexible printed circuits, or the like.

The sockets 142 and connectors 143 may be attached to the redistribution structure 108 in a variety of layouts. The layout shown in FIG. 11 is one example. FIG. 12 is a top-down view of the package component 100. Each socket 142 directly overlies and is electrically coupled to the SoC dies 50A of a corresponding computing site 101A or 101B. The connectors 143 are disposed around the perimeter of the package component 100, thus increasing the area available for the sockets 142. The connecting site 102A may include one or more connectors 143. In the illustrated embodiment, the connectors 143 are laterally offset from the I/O interface dies 50B. In another embodiment, the connectors 143 directly overly the I/O interface dies 50B.

Figure 13:
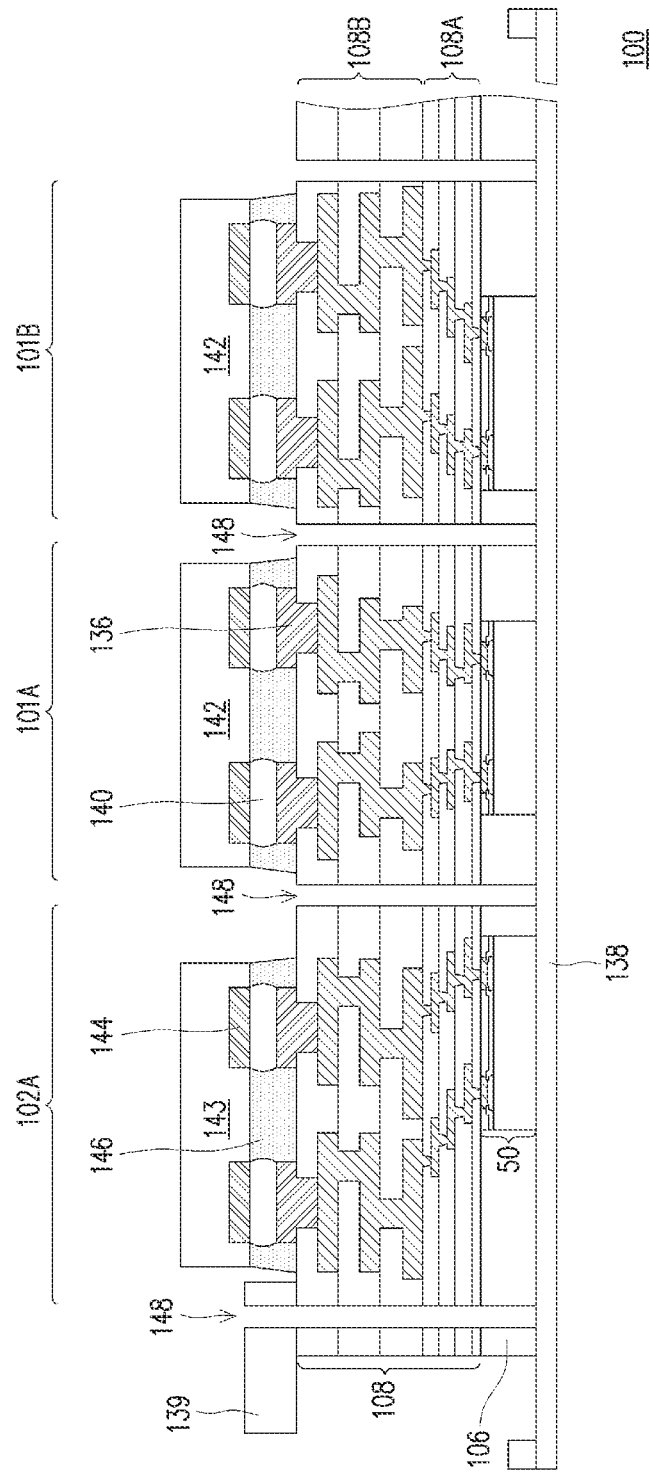

In FIG. 13, bolt holes 148 are formed through the package component 100. The bolt holes 148 may be formed by a drilling process such as laser drilling, mechanical drilling, or the like. The bolt holes 148 may be formed by drilling an outline for the bolt holes 148 with the drilling process, and then removing the material separated by the outline. In some embodiments, some of the bolt holes 148 are formed through the support ring 139. In particular, the bolt holes 148 around the periphery of the package component 100 may be formed through the support ring 139.

Figure 14:
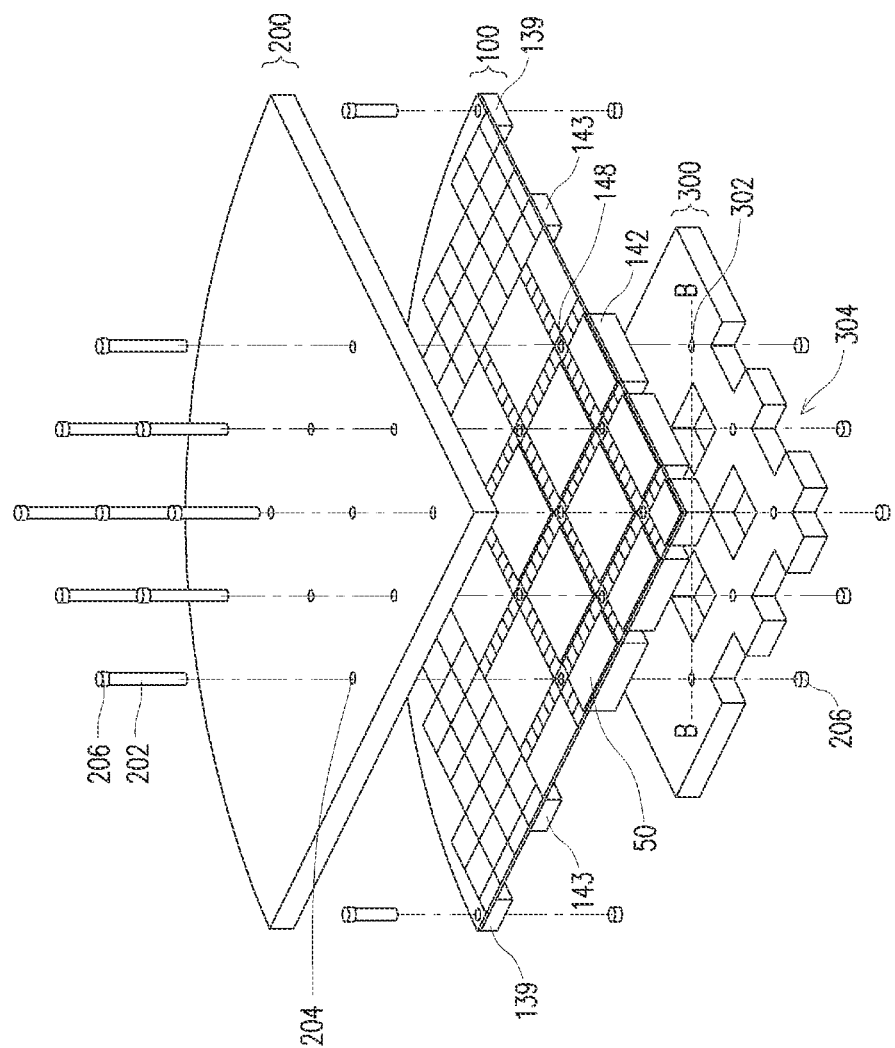
FIGS. 14 and 15 illustrate various view of a process for securing a package component between a thermal module and a mechanical brace, in accordance with some embodiments.
Figure 15:
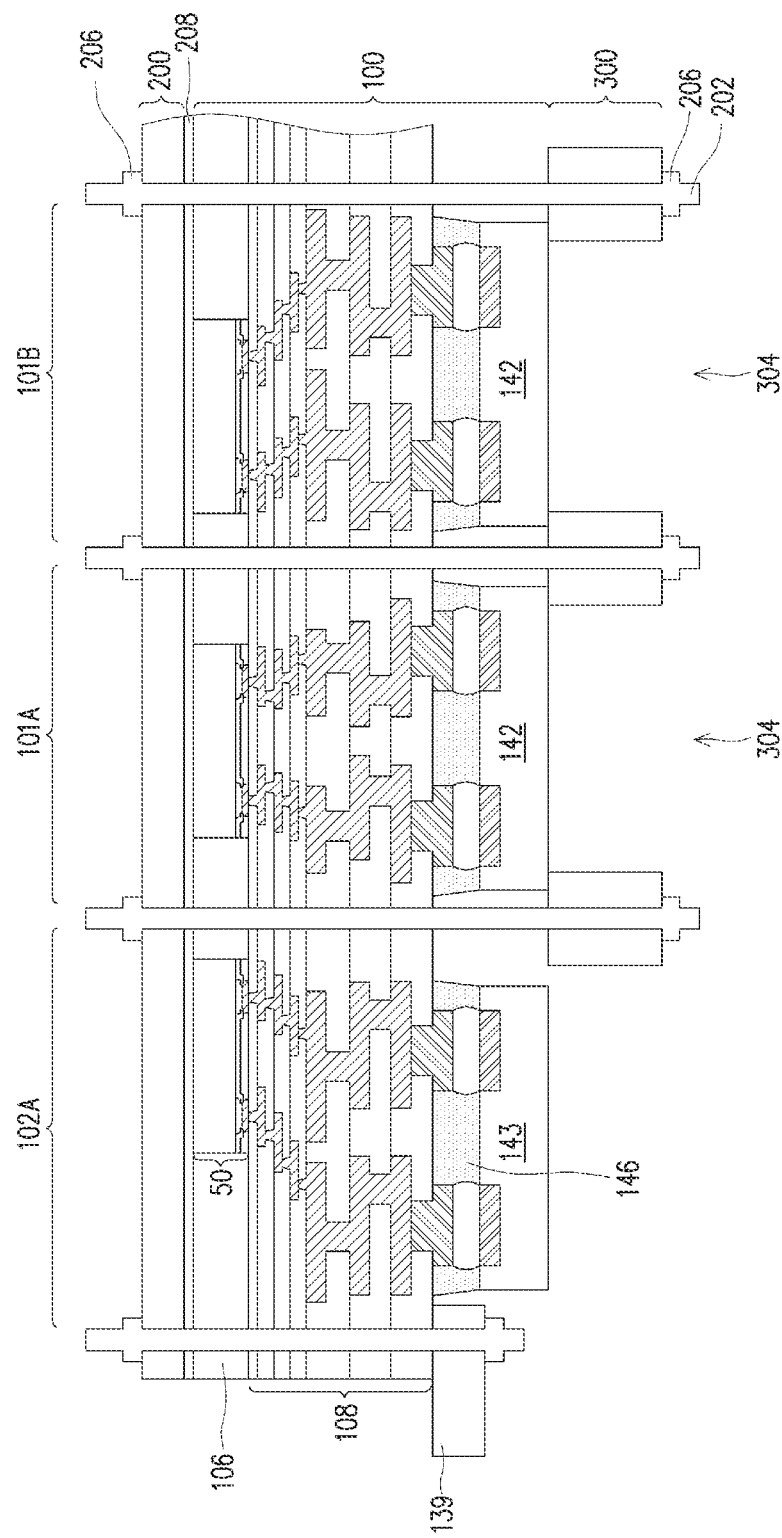

FIGS. 14 and 15 illustrate various view of a process for securing the package component 100 between a thermal module 200 and a mechanical brace 300, in accordance with some embodiments. The thermal module 200 may be a heat sink, a heat spreader, a cold plate, or the like. The mechanical brace 300 is a rigid support that may be formed from a material with a high stiffness, such as a metal, e.g., steel, titanium, cobalt, or the like. The mechanical brace 300 physically engages portions of the sockets 142, securing the sockets 142 when modules are installed or removed. Warpage of the package component 100, such as that induced by carrier substrate debonding, may be reduced by clamping the package component 100 between the thermal module 200 and mechanical brace 300. FIG. 14 is a three-dimensional view illustrating one quarter of the package component 100, thermal module 200, and mechanical brace 300 during assembly, in accordance with some embodiments. Some details are omitted in FIG. 14 for clarity of illustration. FIG. 15 is a cross-sectional view illustrating portions of the package component 100, thermal module 200, and mechanical brace 300 after assembly, and is described in conjunction with FIG. 14. FIG. 15 is illustrated along reference cross-section B-B in FIG. 14.

The package component 100 is removed from the tape 138 and is fastened between the thermal module 200 and mechanical brace 300 with bolts 202. The bolts 202 are threaded through the bolt holes 148 of the package component 100, through corresponding bolt holes 204 in the thermal module 200, and through corresponding bolt holes 302 in the mechanical brace 300. Fasteners 206 are threaded onto the bolts 202 and tightened to clamp the package component 100 between the thermal module 200 and mechanical brace 300. The fasteners 206 may be, e.g., nuts that thread to the bolts 202. The fasteners 206 attach to the bolts 202 at both sides of the resulting system-on-wafer assembly (e.g., at the side having the thermal module 200 (sometimes referred to as the back side) and at the side having the mechanical brace 300 (sometimes referred to as the front side)). In some embodiments, the bolts 202 and fasteners 206 also mechanically fasten the support ring 139 to the redistribution structure 108. After the mechanical brace 300 is secured, it is laterally disposed inside of the support ring 139 such that the support ring 139 laterally surrounds the mechanical brace 300.

Before fastening together the various components, a thermal interface material (TIM) 208 (see FIG. 15) is dispensed on the back side of the package component 100, physically and thermally coupling the thermal module 200 to the integrated circuit dies 50. During fastening, the fasteners 206 are tightened, thereby increasing the mechanical force applied to the package component 100 by the thermal module 200 and the mechanical brace 300. The fasteners 206 are tightened until the thermal module 200 exerts a desired amount of pressure on the TIM 208. For example, the tightening of the fasteners 206 may be performed with a torque in the range of about 0.01 N·m to about 3.5 N·m.

As noted above, the support ring 139 helps reduce warpage of the package component 100, such as warpage induced by carrier substrate debonding, and also helps increase the uniformity of the heights of the sockets 142 and connectors 143. As such, when mechanical force is applied with the fasteners 206, the uniformity of the pressure distribution across the TIM 208 at the computing sites 101A and 101B may be improved. The thermal resistance of the TIM 208 depends on the pressure exerted upon it, with a greater pressure resulting in a lower thermal resistance. However, beyond a sufficient amount of applied pressure, the thermal resistance of the TIM 208 may not decrease any further. By tightening the fasteners 206 beyond the point where no further thermal resistance reduction can be achieved, and by increasing the uniformity of the pressure distribution across the TIM 208, the thermal resistance of substantially all regions of the TIM 208 may be minimized, within the limits of the material of the TIM 208.

The mechanical brace 300 has openings 304 exposing portions of the sockets 142, for ease of module installation. The edge regions of the mechanical brace 300, such as edge regions of the outermost periphery and edge regions of the openings 304, physically engage and overlap with edge regions of the sockets 142. In some embodiments, the mechanical brace 300 only engages some edge regions of the sockets 142.

Figure 16:
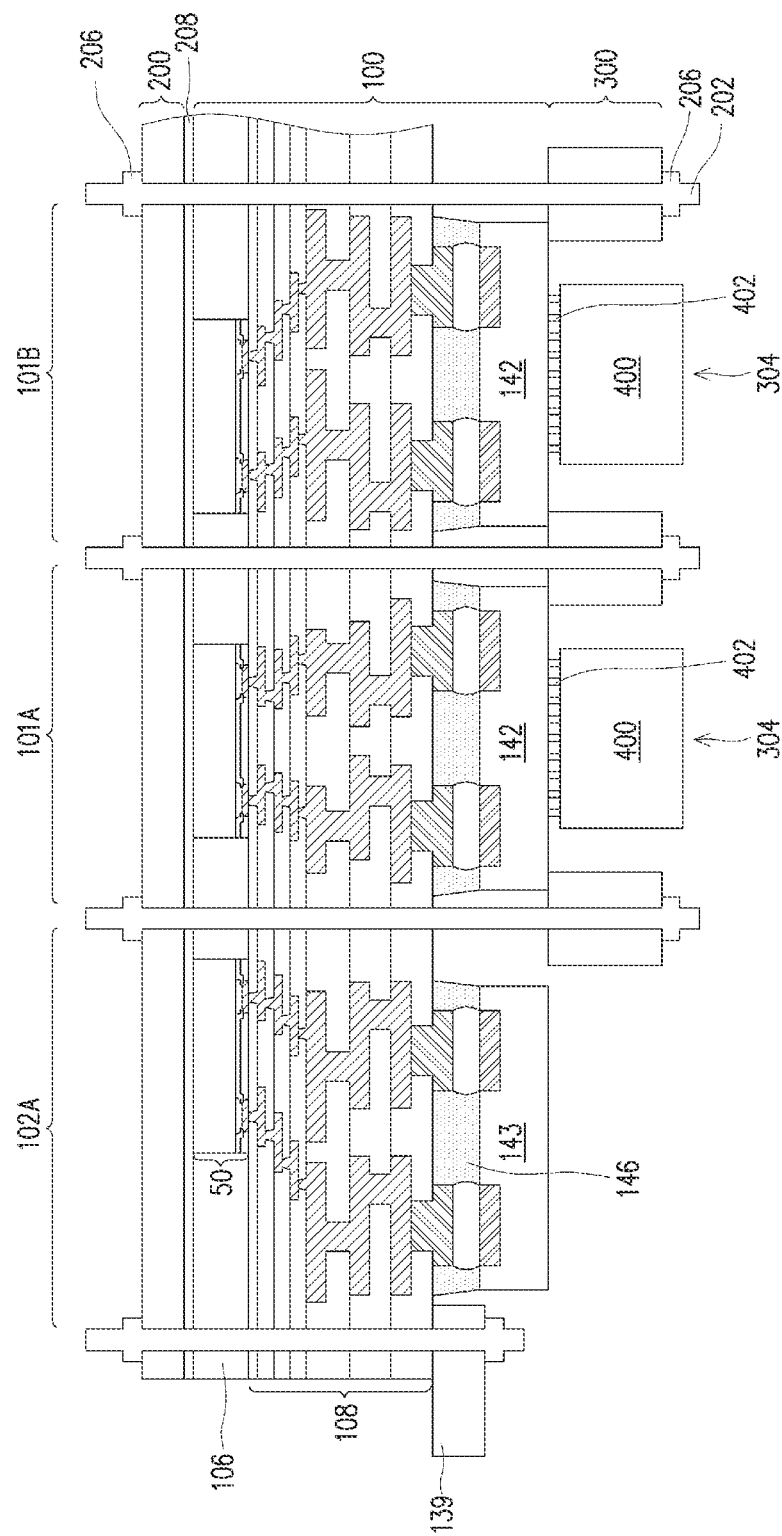
FIG. 16 illustrates a cross-sectional view of module installation in a system-on-wafer assembly, in accordance with some embodiments.

FIG. 16 illustrates a cross-sectional view of the resulting system-on-wafer assembly after modules 400 are installed in the sockets 142. FIG. 16 is illustrated along reference cross-section B-B in FIG. 14. As noted above, the modules 400 may be memory modules, voltage regulator modules, power supply modules, integrated passive device (IPD) modules, and the like. The modules 400 comprise conductive connectors 402, which are inserted in corresponding receptors to physically and electrically couple the contact pins of the sockets 142. The modules 400 are thus secured in the sockets 142, forming completed functional systems at the computing sites 101A and 101B. After installation, the modules 400 are disposed in the openings 304 of the mechanical brace 300.

Figure 17:
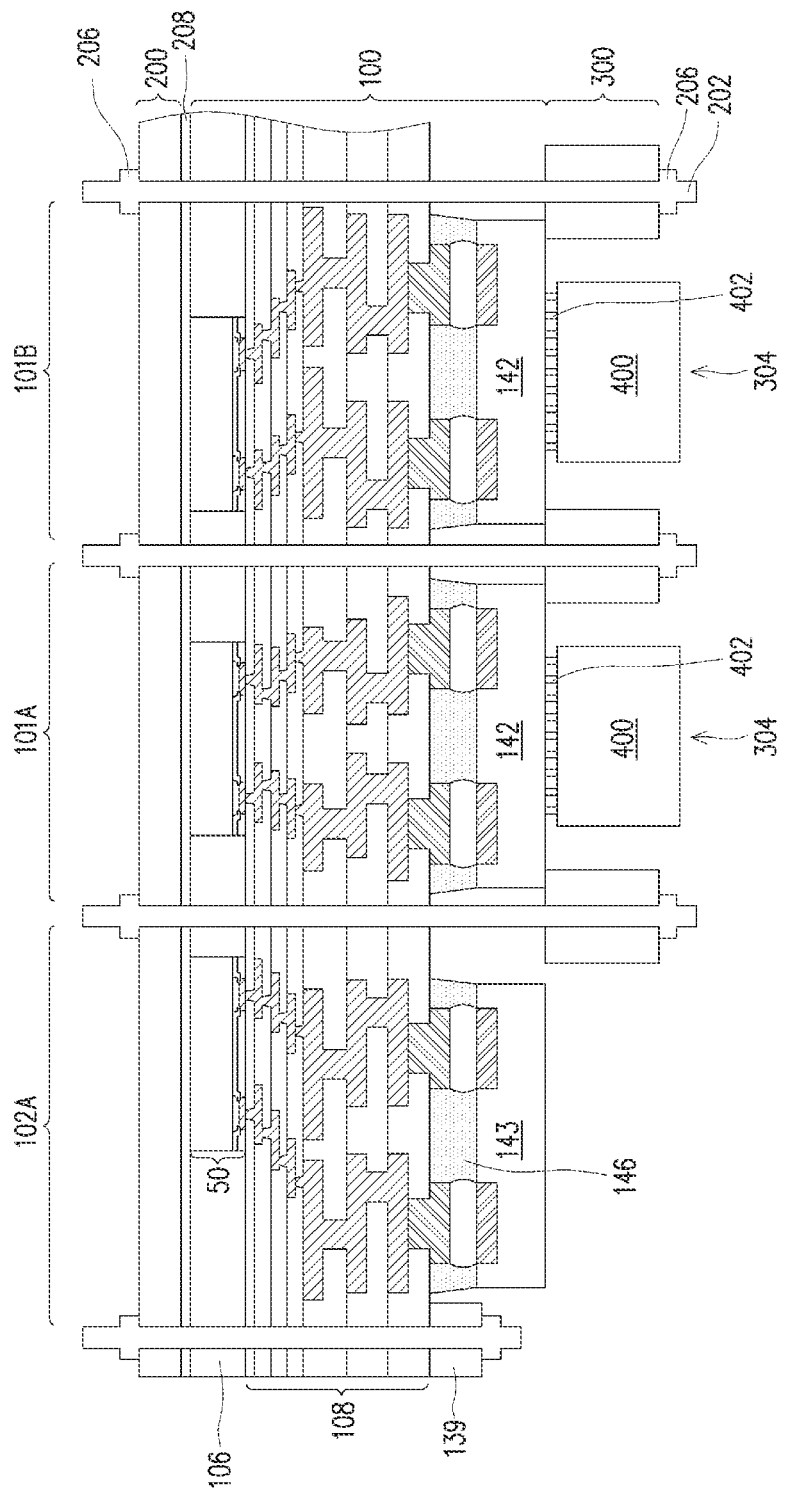
FIG. 17 illustrates a cross-sectional view of a system-on-wafer assembly, in accordance with some other embodiments.

FIG. 17 illustrates a cross-sectional view of a system-on-wafer assembly, in accordance with some other embodiments. FIG. 17 is illustrated along reference cross-section B-B in FIG. 14. In this embodiment, the support ring 139 is laterally confined within edges of the redistribution structure 108. In other words, the support ring 139 completely laterally overlaps the redistribution structure 108, and does not laterally extend beyond edges of the redistribution structure 108.

Figure 18:
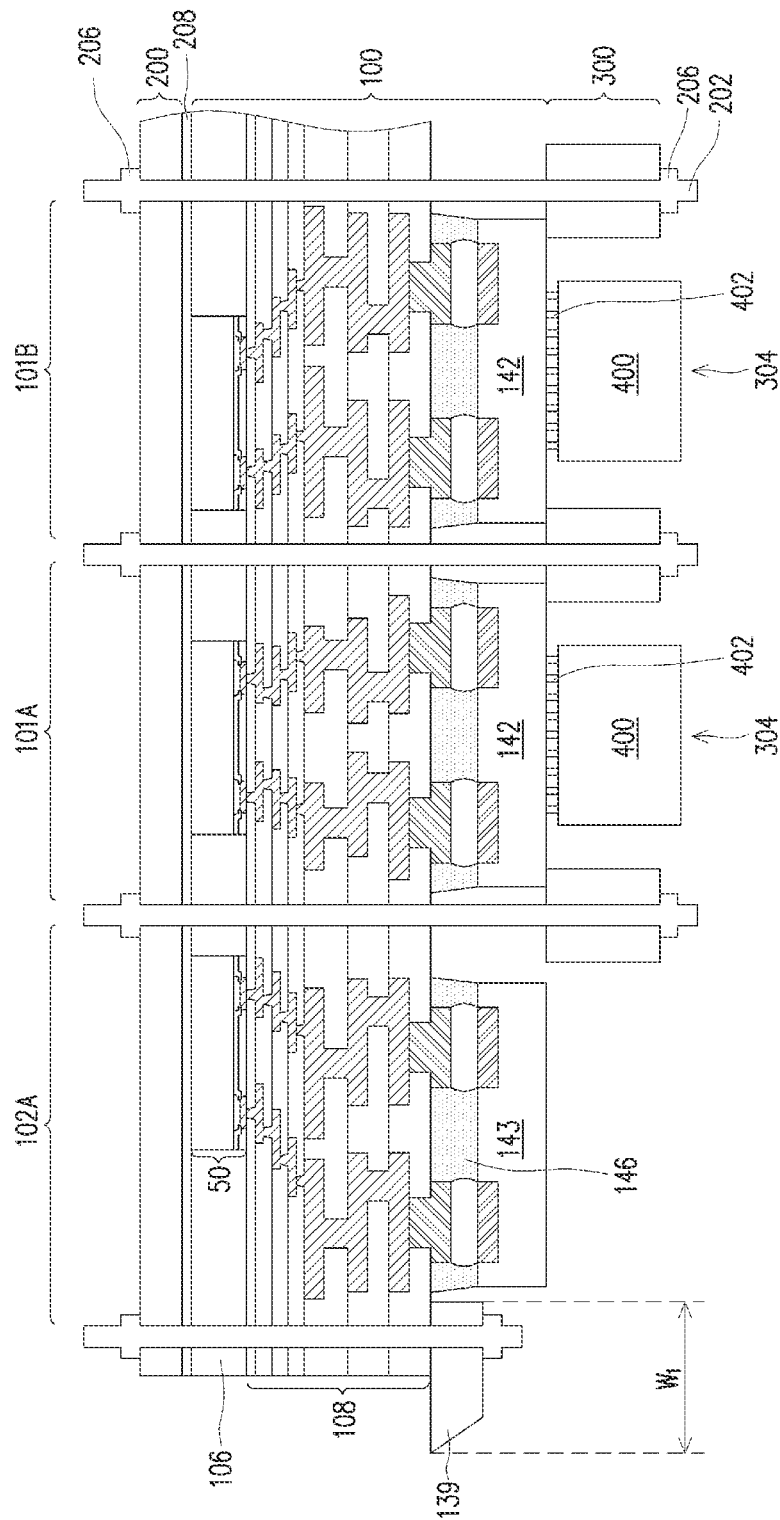
FIG. 18 illustrates a cross-sectional view of a system-on-wafer assembly, in accordance with some other embodiments.

FIG. 18 illustrates a cross-sectional view of a system-on-wafer assembly, in accordance with some other embodiments. FIG. 18 is illustrated along reference cross-section B-B in FIG. 14. In this embodiment, the support ring 139 does not have a constant width $W_1$, but rather, has a varying width $W_1$. The width $W_1$ decreases continually, in a direction extending away from a major surface of the redistribution structure 108 (e.g., in a direction extending from the package component 100 to the mechanical brace 300). The width $W_1$ may decrease linearly (as illustrated) or non-linearly (not illustrated)

Figure 19:
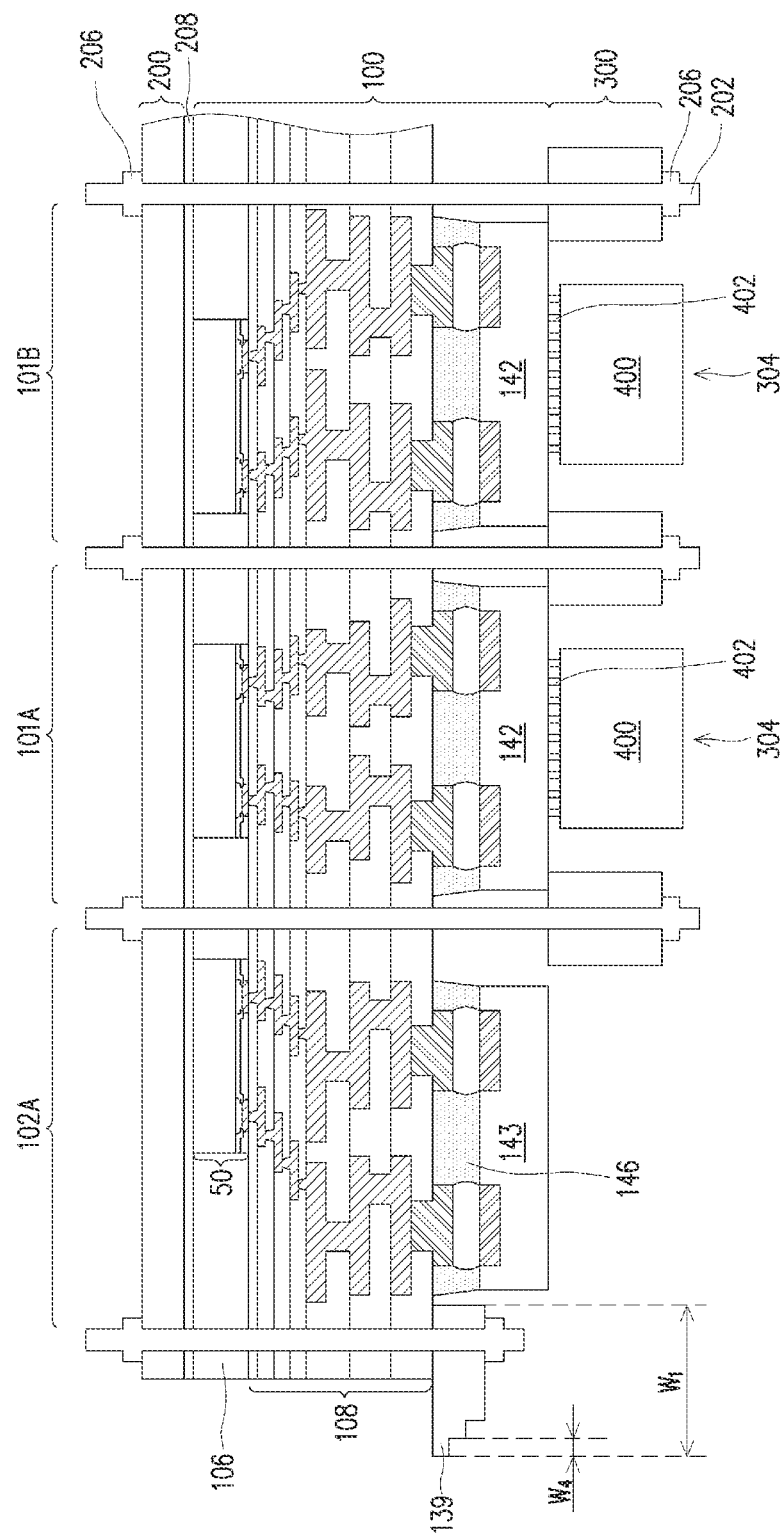
FIG. 19 illustrates a cross-sectional view of a system-on-wafer assembly, in accordance with some other embodiments.

FIG. 19 illustrates a cross-sectional view of a system-on-wafer assembly, in accordance with some other embodiments. FIG. 19 is illustrated along reference cross-section B-B in FIG. 14. In this embodiment, the support ring 139 does not have a constant width $W_1$, but rather, has a varying width $W_1$. The width $W_1$ decreases in steps, in a direction extending away from a major surface of the redistribution structure 108 (e.g., in a direction extending from the package component 100 to the mechanical brace 300). Each step of the decrease has a width $W_4$, which can be in the range of about 0.1 mm to about 1 mm.

Figure 20:
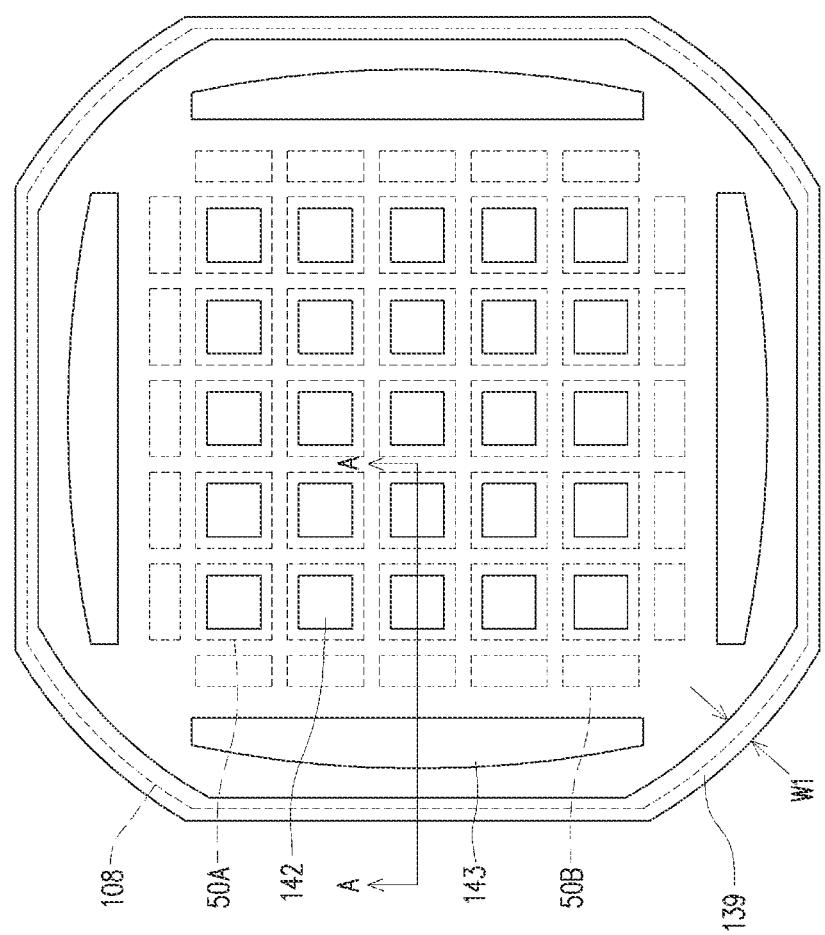
FIG. 20 illustrates a top-down view of a package component, in accordance with some embodiments.

FIG. 20 illustrates a top-down view of the package component 100, in accordance with some other embodiments. As noted above, the package component 100 and support ring 139 may have several possible shapes in the top-down view. In this embodiment, the package component 100 and support ring 139 have truncated circular shapes. Use of a truncated circular shape may help reduce the total space occupied by the resulting system-on-wafer assembly, increasing the amount of system-on-wafer assembly that may be included in an external system.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments may achieve advantages. Attaching the support ring 139 to the package component 100 may reduce warpage of the package component 100. The heights of the sockets 142 and connectors 143 may thus be more uniform, thereby improving the quality of joints formed between the UBMs 136 and the sockets 142 and connectors 143. Further, the uniformity of the pressure distribution across the TIM 208 at the computing sites 101A and 101B may be improved when the package component 100 is clamped between the thermal module 200 and mechanical brace 300. Thermal dissipation from the assembly may thus be improved. Finally, the support ring 139 provides some protection to edges of the package component 100, reducing the risk of damage when handling the package component.

In an embodiment, a device includes: a package component including: integrated circuit dies; an encapsulant around the integrated circuit dies; a redistribution structure over the encapsulant and the integrated circuit dies, the redistribution structure being electrically coupled to the integrated circuit dies; sockets over the redistribution structure, the sockets being electrically coupled to the redistribution structure; and a support ring over the redistribution structure and surrounding the sockets, the support ring being disposed along outermost edges of the redistribution structure, the support ring at least partially laterally overlapping the redistribution structure.

In some embodiments of the device, the support ring has a first portion laterally overlapping the redistribution structure, and a second portion extending beyond the outermost edges of the redistribution structure. In some embodiments of the device, the support ring is laterally confined within the outermost edges of the redistribution structure. In some embodiments of the device, the support ring has a constant width. In some embodiments of the device, the support ring has a width decreasing in a direction extending away from a major surface of the redistribution structure. In some embodiments of the device, the width of the support ring decreases linearly. In some embodiments of the device, the width of the support ring decreases in steps. In some embodiments of the device, the support ring has a non-truncated circular shape. In some embodiments of the device, the support ring has a truncated circular shape. In some embodiments, the device further includes: a mechanical brace physically coupled to the sockets, the support ring laterally surrounding the mechanical brace. In some embodiments, the device further includes: a thermal module physically and thermally coupled to the encapsulant and the integrated circuit dies; first bolts extending through the mechanical brace, the redistribution structure, the encapsulant, and the thermal module; and second bolts extending through the support ring, the redistribution structure, the encapsulant, and the thermal module.

In an embodiment, a method includes: placing integrated circuit dies on a carrier substrate; encapsulating the integrated circuit dies with an encapsulant; forming a redistribution structure over the encapsulant and the integrated circuit dies, the redistribution structure having a first diameter; adhering a support ring to the redistribution structure, the support ring having an inner diameter and an outer diameter, the inner diameter being less than the first diameter, the outer diameter being greater than the inner diameter; and after attaching the support ring to the redistribution structure, debonding the carrier substrate from the integrated circuit dies and the encapsulant; and attaching sockets to the redistribution structure, the sockets being surrounded by the support ring.

In some embodiments, the method further includes: drilling first bolt holes through the support ring, the redistribution structure, and the encapsulant; and bolting the support ring to the redistribution structure with first bolts extending through the first bolt holes. In some embodiments, the method further includes: drilling second bolt holes extending through the redistribution structure and the encapsulant; bolting a mechanical brace to the sockets with second bolts extending through the second bolt holes. In some embodiments, the method further includes: bolting a thermal module to the integrated circuit dies and the encapsulant with the second bolts. In some embodiments of the method, the outer diameter is greater than the first diameter. In some embodiments of the method, the outer diameter is equal to the first diameter.

In an embodiment, a method includes: assembling a package component between a thermal module and a mechanical brace with bolts extending through the thermal module, the package component, and the mechanical brace, where the package component includes: integrated circuit dies; an encapsulant around the integrated circuit dies; a redistribution structure over the encapsulant and the integrated circuit dies, the redistribution structure being electrically coupled to the integrated circuit dies; sockets over the redistribution structure, the sockets being electrically coupled to the redistribution structure; external connectors over the redistribution structure, the external connectors being electrically coupled to the redistribution structure; and a support ring over the redistribution structure and surrounding the sockets and the external connectors, the support ring being disposed along outermost edges of the redistribution structure, the support ring at least partially laterally overlapping the redistribution structure; and tightening fasteners on the bolts to increase force applied to the package component by the thermal module and the mechanical brace.

In some embodiments, the method further includes: inserting modules in the sockets. In some embodiments, the method further includes: connecting the external connectors to an external system.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a package component comprising:
      integrated circuit dies;
      an encapsulant around the integrated circuit dies;
      a redistribution structure over the encapsulant, the redistribution structure comprising redistribution lines that are electrically coupled to the integrated circuit dies; and
      a support ring over the redistribution structure, the support ring being disposed along outermost edges of the redistribution structure, the support ring at least partially laterally overlapping the redistribution structure.

2. The device of claim 1, wherein the support ring has a first portion laterally overlapping the redistribution structure, and a second portion extending beyond the outermost edges of the redistribution structure.

3. The device of claim 1, wherein the support ring is laterally confined within the outermost edges of the redistribution structure.

4. The device of claim 1, wherein the support ring has a constant width.

5. The device of claim 1, wherein the support ring has a width decreasing in a direction extending away from a major surface of the redistribution structure.

6. The device of claim 5, wherein the width of the support ring decreases linearly.

7. The device of claim 5, wherein the width of the support ring decreases in steps.

8. The device of claim 1, further comprising:
   sockets over the redistribution structure, the support ring surrounding the sockets; and
   a mechanical brace physically coupled to the sockets.

9. The device of claim 1, further comprising:
   external connectors over the redistribution structure, the support ring surrounding the external connectors.

10. The device of claim 1, wherein the support ring comprises steel, titanium, or cobalt.

11. A device comprising:
    a mechanical brace;
    a thermal module; and
    a package component between the thermal module and the mechanical brace, the package component comprising:
       integrated circuit dies;
       an encapsulant around the integrated circuit dies;
       a redistribution structure over the encapsulant, the redistribution structure comprising redistribution lines that are electrically coupled to the integrated circuit dies; and
       a support ring over the redistribution structure, the support ring being disposed along outermost edges of the redistribution structure, a Young's modulus of the support ring being greater than a Young's modulus of the redistribution structure, the encapsulant, and the integrated circuit dies.

12. The device of claim 11, wherein outermost edges of the support ring extend beyond the outermost edges of the redistribution structure.

13. The device of claim 11, further comprising:
    sockets over the redistribution structure, the support ring surrounding the sockets.

14. A device comprising:
    a mechanical brace;
    a thermal module; and
    a package component between the thermal module and the mechanical brace, the package component comprising:
       an encapsulant;
       integrated circuit dies in the encapsulant;
       a redistribution structure comprising redistribution lines connected to the integrated circuit dies; and
       a support ring adhered to the redistribution structure, the support ring surrounding the mechanical brace in a top-down view, the support ring having a greater Young's modulus than the redistribution structure, the integrated circuit dies, and the encapsulant.

15. The device of claim 14, wherein the support ring has a non-truncated circular shape in the top-down view.

16. The device of claim 14, wherein the support ring has a truncated circular shape in the top-down view.

17. The device of claim 14, wherein the support ring extends along outermost edges of the redistribution structure, the support ring partially overlapping the redistribution structure and partially extending beyond the outermost edges of the redistribution structure.

18. The device of claim 14, wherein the support ring extends along outermost edges of the redistribution structure, the support ring completely overlapping the redistribution structure.

19. The device of claim 14, further comprising:
connection interfaces connected to the redistribution lines of the redistribution structure, the support ring surrounding the connection interfaces in the top-down view.

20. The device of claim 14, wherein the support ring comprises a metal.

* * * * *